United States Patent
Baek et al.

(10) Patent No.: US 9,837,437 B2
(45) Date of Patent: Dec. 5, 2017

(54) INTEGRATED CIRCUIT, SEMICONDUCTOR DEVICE BASED ON INTEGRATED CIRCUIT, AND STANDARD CELL LIBRARY

(71) Applicant: Samsung Electronics Co., Ltd., Suwon-si, Gyeonggi-do (KR)

(72) Inventors: Sang-hoon Baek, Seoul (KR); Sang-kyu Oh, Gwacheon-si (KR); Jung-Ho Do, Yongin-si (KR); Sun-young Park, Seoul (KR); Seung-young Lee, Incheon (KR); Hyo-sig Won, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/612,349

(22) Filed: Jun. 2, 2017

(65) Prior Publication Data
US 2017/0271367 A1    Sep. 21, 2017

Related U.S. Application Data

(63) Continuation of application No. 15/232,223, filed on Aug. 9, 2016, now Pat. No. 9,716,106, which is a (Continued)

(30) Foreign Application Priority Data

Jan. 9, 2015    (KR) .................. 10-2015-0003466

(51) Int. Cl.
*H01L 27/118*    (2006.01)
*H01L 29/78*    (2006.01)
(Continued)

(52) U.S. Cl.
CPC .... *H01L 27/11807* (2013.01); *H01L 27/0207* (2013.01); *H01L 27/0924* (2013.01);
(Continued)

(58) Field of Classification Search
CPC .................. H01L 27/11807; H01L 27/0924
(Continued)

(56) References Cited

U.S. PATENT DOCUMENTS 6,662,350 B2    12/2003    Fried et al.
6,943,405 B2    9/2005    Bryant et al.
(Continued)

FOREIGN PATENT DOCUMENTS

JP    4056398 B2    3/2008
JP    5041808 B2    10/2012
(Continued)

*Primary Examiner* — Anthony Ho
(74) *Attorney, Agent, or Firm* — Harness, Dickey & Pierce, P.L.C.

(57) ABSTRACT

An integrated circuit (IC) may include at least one cell including a plurality of conductive lines that extend in a first direction and are in parallel to each other in a second direction that is perpendicular to the first direction, first contacts respectively disposed at two sides of at least one conductive line from among the plurality of conductive lines, and a second contact disposed on the at least one conductive line and the first contacts and forming a single node by being electrically connected to the at least one conductive line and the first contacts.

30 Claims, 21 Drawing Sheets

Related U.S. Application Data continuation of application No. 14/801,121, filed on Jul. 16, 2015, now Pat. No. 9,431,383.

(60) Provisional application No. 62/027,401, filed on Jul. 22, 2014.

(51) Int. Cl.
| | | |
|---|---|---|
| *H01L 27/02* | (2006.01) | |
| *H01L 29/423* | (2006.01) | |
| *H01L 29/66* | (2006.01) | |
| *H01L 27/092* | (2006.01) | |

(52) U.S. Cl.
CPC .... *H01L 29/42384* (2013.01); *H01L 29/6681* (2013.01); *H01L 29/785* (2013.01); *H01L 2027/11875* (2013.01)

(58) Field of Classification Search
USPC .......................................................... 257/203
See application file for complete search history.

(56) References Cited

U.S. PATENT DOCUMENTS

| | | |
|---|---|---|
| 7,315,994 B2 | 1/2008 | Aller et al. |
| 7,517,806 B2 | 4/2009 | Bryant et al. |
| 7,737,501 B2 | 6/2010 | Zhu et al. |
| 7,812,373 B2 | 10/2010 | Bauer et al. |
| 8,026,138 B2 | 9/2011 | Lee |
| 8,561,003 B2 | 10/2013 | Kawa et al. |
| 8,595,661 B2 | 11/2013 | Kawa et al. |
| 8,847,361 B2 | 9/2014 | Liaw et al. |
| 2008/0169487 A1 | 7/2008 | Shimbo et al. |
| 2010/0127333 A1 | 5/2010 | Hou et al. |
| 2010/0287518 A1 | 11/2010 | Becker |
| 2011/0195564 A1 | 8/2011 | Liaw et al. |

FOREIGN PATENT DOCUMENTS

| | | |
|---|---|---|
| KR | 10-0702552 B1 | 4/2007 |
| KR | 10-0990599 B1 | 10/2010 |
| KR | 10-1022250 B1 | 3/2011 |
| KR | 10-1087864 B1 | 11/2011 |
| KR | 10-1291574 B1 | 8/2013 |

☐ : CELL BOUNDARY

INTEGRATED CIRCUIT, SEMICONDUCTOR DEVICE BASED ON INTEGRATED CIRCUIT, AND STANDARD CELL LIBRARY

CROSS-REFERENCE TO RELATED APPLICATION

This application is a continuation application of U.S. application Ser. No. 15/232,223, filed Aug. 9, 2016, which is a continuation application of U.S. application Ser. No. 14/801,121, filed on Jul. 16, 2015, which claims the benefit of U.S. Patent Application No. 62/027,401, filed on Jul. 22, 2014, in the U.S. Patent and Trademark Office, and Korean Patent Application No. 10-2015-0003466, filed on Jan. 9, 2015, in the Korean Intellectual Property Office, the entire disclosures of each of which are hereby incorporated by reference herein.

BACKGROUND

Example embodiments of the inventive concepts relate to an integrated circuit (IC) including at least one cell, a semiconductor device based on the IC, and/or a standard cell library that stores information about same.

As the size of transistors is reduced and semiconductor manufacturing technology further develops, more transistors may be integrated in semiconductor devices. For example, a system-on-chip (SOC), which refers to an integrated circuit (IC) that integrates all components of a computer or other electronic system into a single chip, is used in various applications. The increasing performance demands of applications may demand semiconductor devices that include more components.

SUMMARY

According to at least one example embodiment of the inventive concepts, an integrated circuit (IC) may include at least one cell, the at least one including a plurality of conductive lines that extend in a first direction and are disposed in parallel to each other in a second direction that is perpendicular to the first direction, first contacts respectively disposed at two sides of at least one conductive line from among the plurality of conductive lines, and a second contact disposed on the at least one conductive line and the first contacts, and forming a single node by being electrically connected to the at least one conductive line and the first contacts.

According to other example embodiments of the inventive concepts, a semiconductor device may include a substrate including first and second active regions having different conductive types, a plurality of conductive lines that extend in a first direction and are disposed in parallel to each other in a second direction that is perpendicular to the first direction, first contacts respectively disposed at two sides of at least one conductive line from among the plurality of conductive lines, and a second contact disposed on the at least one conductive line and the first contacts in at least one of the first and second active regions, and forming a single node by being electrically connected to the at least one conductive line and the first contacts.

According to other example embodiments of the inventive concepts, a standard cell library stored in a non-transitory computer-readable storage medium may include information about a plurality of standard cells. At least one of the plurality of standard cells includes first and second active regions having different conductive types, a plurality of fins disposed in parallel to each other in the first and second active regions, a plurality of conductive lines that extend in a first direction and are disposed in parallel to each other in a second direction that is perpendicular to the first direction, above the plurality of fins, first contacts respectively disposed at two sides of at least one conductive line from among the plurality of conductive lines, and a second contact forming a single node by being electrically connected to the at least one conductive line and the first contacts in at least one of the first and second active regions.

According to other example embodiments, a semiconductor device may include a substrate including a first active region having a first conductive type and a second active region having a second conductive type different from the first conductive type; a plurality of gate electrodes extending in a first direction such that the plurality of gate electrodes are parallel to each other in a second direction, the second direction being perpendicular to the first direction; first contacts at a respective one of two sides of a skipped gate electrode of the plurality of gate electrodes, the skipped gate electrode being one of the plurality of gate electrodes whose electrode is connected to the first contacts; and a second contact electrically connected to the skipped gate electrode and the first contacts in the first active region such that the second contact, the at least one conductive line and the first contacts form a single node in the first active region.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
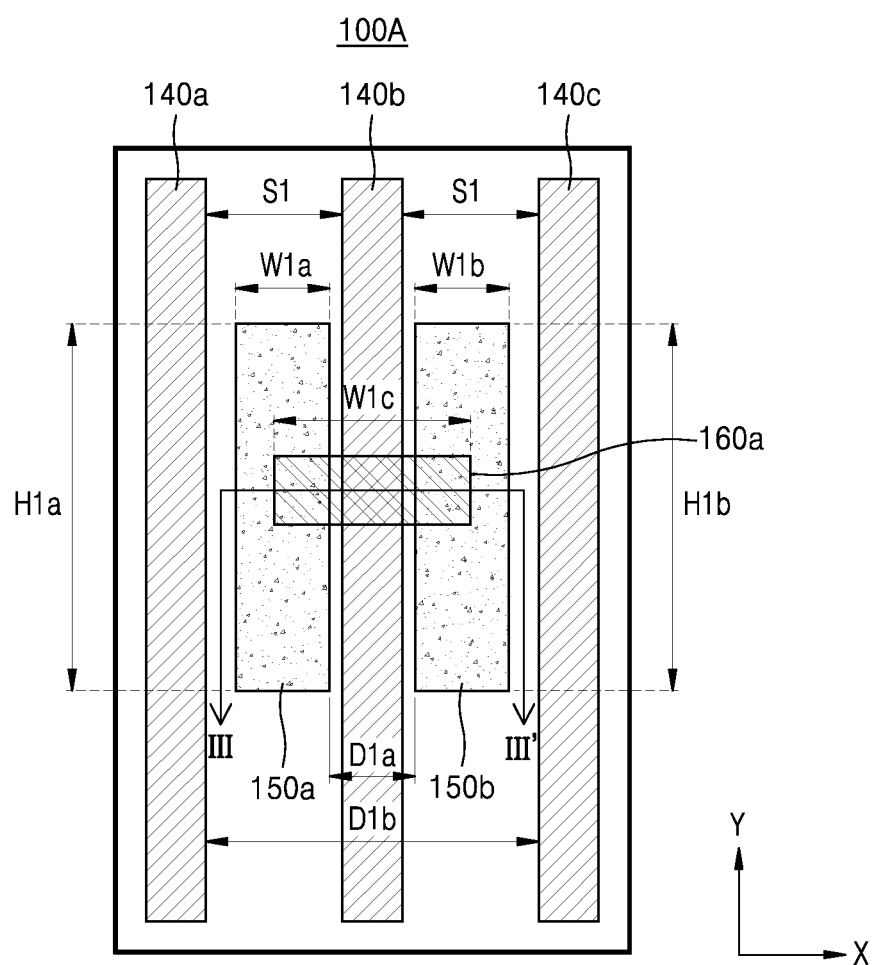
FIG. 1 is a layout illustrating a portion of an integrated circuit (IC) according to an example embodiment.

Reference will now be made in detail to example embodiments, some examples of which are illustrated in the accompanying drawings, wherein like reference numerals refer to like elements throughout. These example embodiments are provided so that this disclosure will be thorough and complete, and will fully convey the present inventive concept to those of ordinary skill in the art. As the inventive concepts allow for various changes and numerous example embodiments, particular example embodiments will be illustrated in the drawings and described in detail in the written description. However, this is not intended to limit the inventive concepts to particular modes of practice, and it is to be appreciated that all changes, equivalents, and substitutes that do not depart from the spirit and technical scope are encompassed in the inventive concepts. Sizes of components in the drawings may be exaggerated for convenience of explanation. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe particular example embodiments, and are not intended to limit the inventive concepts. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, within the scope of the inventive concepts, a first component may be referred to as a second component, and vice versa.

Unless defined otherwise, all terms used in the description including technical or scientific terms have the same meaning as commonly understood by one of ordinary skill in the art to which the example embodiments of the inventive concepts pertain. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

FIG. 1 is a layout illustrating a portion of an integrated circuit (IC) 100A according to an example embodiment.

Referring to FIG. 1, the IC 100A may include at least one cell defined by a cell boundary indicated with a bold line. The cell may include first to third conductive lines 140a to 140c, first contacts 150a and 150b, and a second contact 160a. Although not illustrated, a plurality of conductive lines, for example, metal lines, may be additionally disposed at an upper portion of the cell.

According to some example embodiments, the cell may be a standard cell. According to a method of designing a standard cell layout, repeatedly used devices such as OR gates or AND gates are designed as standard cells in advance and stored in a computer system, and during a layout design process, the standard cells are disposed in necessary locations and wired. Thus, a layout may be designed in a relatively short time.

The first to third conductive lines 140a to 140c may extend in a first direction (e.g., Y direction). Also, the first to third conductive lines 140a to 140c may be disposed in parallel to each other in a second direction (e.g., X direction) that is substantially perpendicular to the first direction. The first to third conductive lines 140a to 140c may be formed of a material having electric conductivity, for example, polysilicon, metal, and metal alloy.

According to an example embodiment, the first to third conductive lines 140a to 140c may correspond to gate electrodes. However, example embodiments are not limited thereto, for example, and the first to third conductive lines 140a to 140c may be conductive traces. Also, although FIG. 1 illustrates that the cell includes the first to third conductive lines 140a to 140c, example embodiments are not limited thereto. For example, the cell may include four or more conductive lines that extend in the first direction and are parallel to each other in the second direction.

The first contacts 150a and 150b may extend in the first direction. Also, the first contacts 150a and 150b may be disposed in parallel to each other in the second direction that is substantially perpendicular to the first direction. The first contacts 150a and 150b may be formed of a material having electric conductivity, for example, polysilicon, metal, and metal alloy. Accordingly, the first contacts 150a and 150b may provide a power voltage or a ground voltage to lower areas between the first to third conductive lines 140a to 140c.

According to some example embodiments, the first contacts 150a and 150b may respectively be disposed at two sides of the second conductive line 140b. Specifically, the first contacts 150a and 150b may include a first left contact 150a disposed at a left side of the second conductive line 140b and a first right contact 150b disposed at a right side of the second conductive line 140b. In other words, the first left contact 150a may be disposed between the first and second conductive lines 140a and 140b, and the first right contact 150b may be disposed between the second and third conductive lines 140b and 140c.

According to some example embodiments, a length of the first left contact 150a in the second direction, that is, a width W1a may be smaller than a space S1 between the first and second conductive lines 140a and 140b. Likewise, a length of the first right contact 150b in the second direction, that is, a width W1b may be smaller than a space S1 between the second and third conductive lines 140b and 140c. According to an example embodiment, the width W1a of the first left contact 150a and the width W1b of the first right contact 150b may be substantially the same. However, example embodiments are not limited thereto. For example, according to another example embodiment, the width W1a of the first left contact 150a may be different from the width W1b of the first right contact 150b.

The second contact 160a may be disposed on the second conductive line 140b and the first contacts 150a and 150b, and may form a single node by being electrically connected to the second conductive line 140b and the first contacts 150a and 150b. Also, the second contact 160a may extend in the second direction, and accordingly, the second contact 160a may be disposed in a direction that horizontally crosses the second conductive line 140b and the first contacts 150a and 150b. The second contact 160a may be formed of a material having electric conductivity, for example, polysilicon, metal, and metal alloy. Accordingly, the second contact 160a may provide, for example, an identical power voltage or an identical ground voltage to the second conductive line 140b and the first contacts 150a and 150b.

According to some example embodiments, a length of the second contact 160a in the second direction, that is, a width W1c may be larger than a distance D1a between the first left contact 150a and the first right contact 150b and smaller than a distance D1b between the first and third conductive lines 140a and 140c. Accordingly, the second contact 160a may be electrically connected to the second conductive line 140b, the first left contact 150a, and the first right contact 150b, but not to the first and third conductive lines 140a and 140c.

According to some example embodiments, a length of the first left contact 150a in the first direction, that is, a height H1a, may be the same as a length of the first right contact 150b in the first direction, that is, a height H1b. Accordingly, the first left contact 150a, the first right contact 150b, and the second contact 160a may form an H-shaped jumper. A jumper is a conducting wire having a relatively short length for connecting two points or two terminals in the IC 100A.

As described above, according to some example embodiments, a single node may be formed by electrically connecting the second conductive line 140b, the first contacts 150a and 150b, and the second contact 160a. Therefore, in the IC 100A manufactured based on the layout shown in FIG. 1, the second conductive line 140b may be skipped or screened. Thus, the H-shaped jumper according to some example embodiments may be referred to as a skip device.

According to some example embodiments, a cell in which the second conductive line 140b is skipped may be designed by electrically connecting the second conductive line 140b, the first contacts 150a and 150b, and the second contact 160a. Therefore, the first contacts 150a and 150b and the second contact 160a may be separated from the second conductive line 140b to reduce (or, alternatively, eliminate) the possibility of an electric short occurring when a jumper is formed.

Information about the above-described layout of the standard cell may be stored in a standard cell library. Specifically, the standard cell library may include information about a plurality of standard cells, and be stored in a computer-readable storage medium. For example, a non-transitory computer-readable storage medium. A standard cell corresponding to the information included in the standard cell library refers to a unit of an IC having a size that satisfies a standard. For example, a height (e.g., a length in the Y direction of FIG. 1) of a layout of the standard cell may be fixed, and a width (e.g., a length in the X direction of FIG. 1) of the standard cell may vary according to standard cells. The standard cell may include an input fin for processing input signals and an output fin for outputting output signals.

An IC may be a plurality of standard cells. An IC design tool may design the IC, that is, finish a layout of the IC by using the standard cell library that includes information about the plurality of standard cells. The IC design tool may place a via on a pin (i.e., an input pin and an output pin) included in a standard cell so that the pin is connected with a pattern on a layer formed after the pin of the standard cell is formed in a semiconductor manufacturing process. That is, by placing the via in the pin of the standard cell, input signals or output signals of the standard cell may be transmitted.

Figure 2:
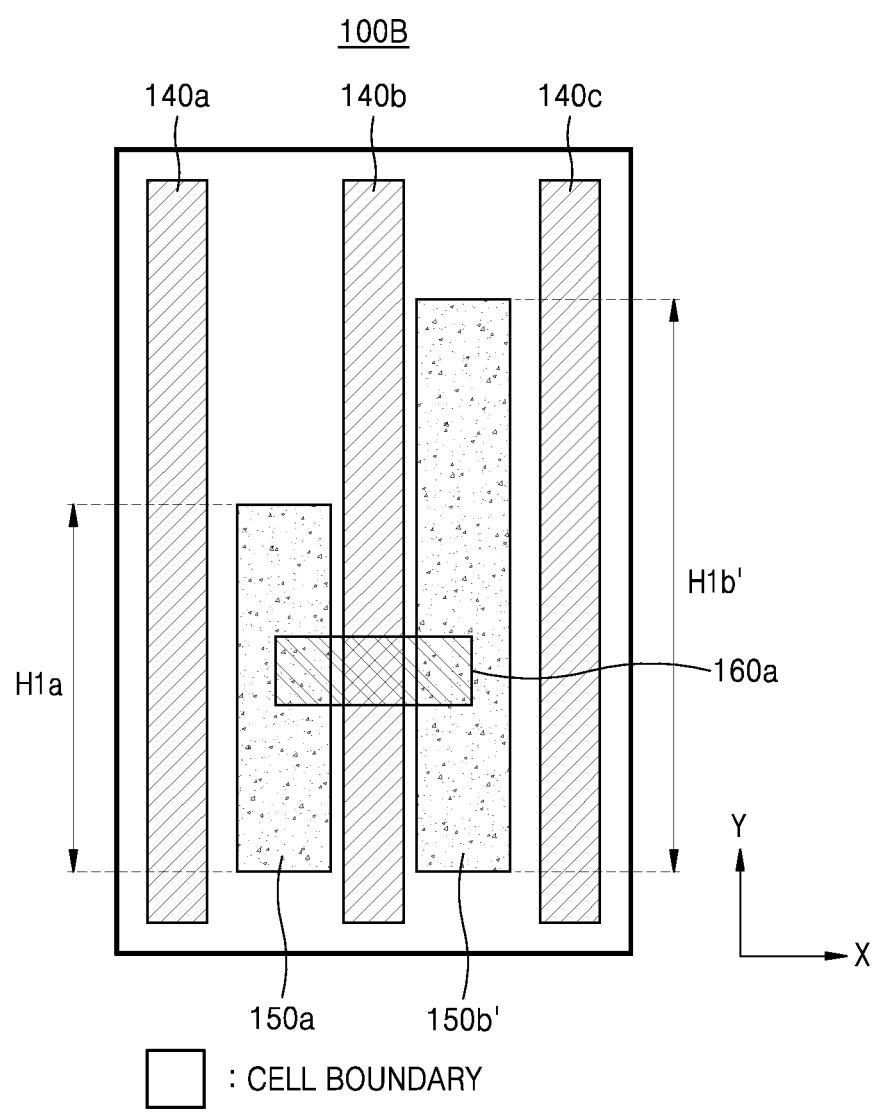
FIG. 2 is a layout illustrating a portion of an IC according to another example embodiment.

FIG. 2 is a layout illustrating a portion of an IC 100B according to other example embodiments.

Referring to FIG. 2, the IC 100B may include the first to third conductive lines 140a to 140c, the first left contact 150a, a first right contact 150b', and the second contact 160a. The IC 100B is a modified example embodiment of the IC 100A shown in FIG. 1. Therefore, at least some of the descriptions of FIG. 1 may also be applied to the IC 100B, and, thus, features and elements already described with reference to FIG. 1 will not be repeated.

According to some example embodiments, a length of the first left contact 150a in the first direction, that is, the height H1a may be different from a length of the first right contact 150b', that is, a height H1b'. Accordingly, the first left contact 150a, the first right contact 150b', and the second contact 160a may form an L-shaped jumper.

According to some example embodiments, the height H1b' of the first right contact 150b' may be greater than the height H1a of the first left contact 150a. According to other example embodiments, the height H1a of the first left contact 150a may be greater than the height H1b' of the first right contact 150b'. The height H1a of the first left contact 150a and the height H1b' of the first right contact 150b' may vary in various example embodiments.

Figure 3:
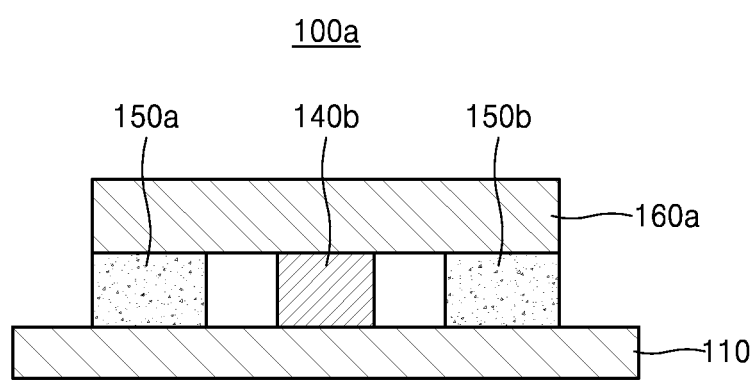
FIG. 3 is a cross-sectional view illustrating an example of a semiconductor device having the layout of FIG. 1, cut along line III-III' of FIG. 1.

FIG. 3 is a cross-sectional view illustrating an example of a semiconductor device 100a having the layout of FIG. 1, cut along line III-III' of FIG. 1.

Referring to FIG. 3, the semiconductor device 100a may include a substrate 110, the second conductive line 140b, the first contacts 150a and 150b, and the second contact 160a. Although not illustrated, a voltage terminal providing, for example, a power voltage or a ground voltage may be additionally disposed on the second contact 160a.

The substrate 110 may be a semiconductor substrate that includes any one selected from, for example, silicon, silicon-on-insulator (SOI), silicon-on-sapphire, germanium, silicon-germanium, and gallium-arsenide. For example, the substrate 110 may be a P-type substrate. Also, although not illustrated, the substrate 110 may have an active region that is doped with impurities.

The second conductive line 140b may be disposed on the substrate 110. According to some example embodiments, the second conductive line 140b may be used as a gate electrode. In this case, a gate insulating layer may be additionally disposed between the second conductive line 140b and the active region of the substrate 110.

The first contacts 150a and 150b may be disposed on the substrate 110. Therefore, the first contacts 150a and 150b may provide, for example, a power voltage or a ground voltage in the active region of the substrate 110. According to some example embodiments, the first contacts 150a and 150b may respectively be disposed at two sides of the second conductive line 140b. According to some example embodiments, upper portions of the first contacts 150a and 150b may be at a same level as an upper portion of the second conductive line 140b.

The second contact 160a may be disposed on the second conductive line 140b and the first contacts 150a and 150b, and form a single node by being electrically connected to the second conductive line 140b and the first contacts 150a and 150b.

Figure 4:
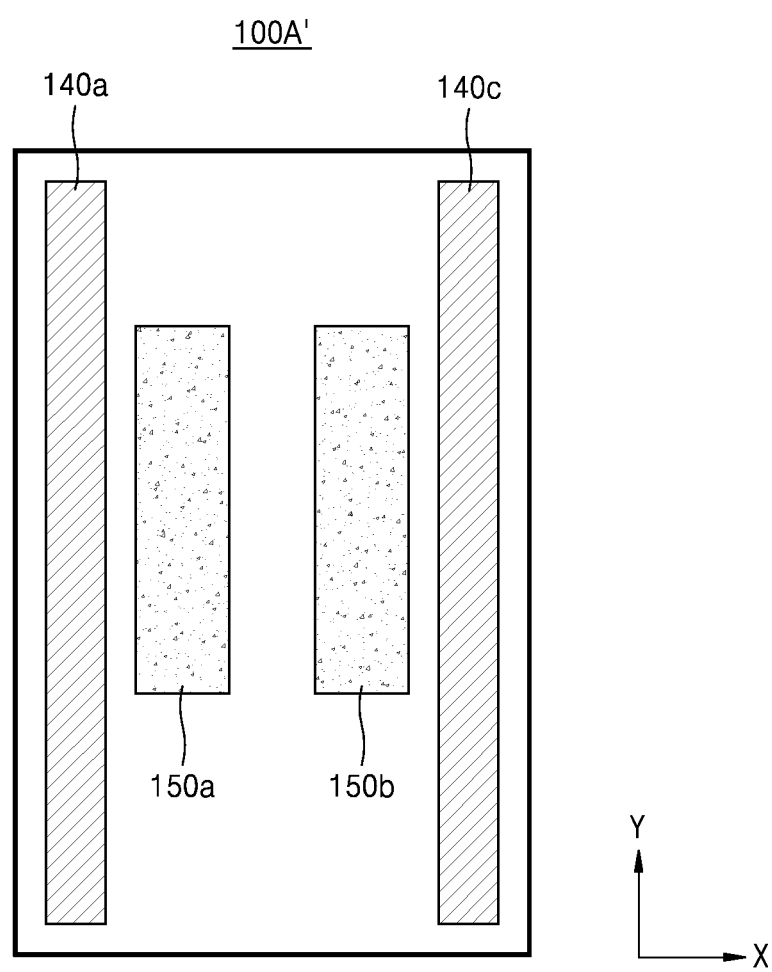
FIG. 4 is a layout illustrating a portion of an IC that is substantially the same as the example embodiment of FIG. 1.

FIG. 4 is a layout illustrating a portion of an IC 100A' that is substantially the same as the example embodiment of FIG. 1.

Referring to FIG. 4, the IC 100A' may include the first and third conductive lines 140a and 140c and the first contacts 150a and 150b. The first contacts 150a and 150b may be connected to a single metal line that is disposed at an upper portion. According to other example embodiments, the IC 100A' may include only one of the first contacts 150a and 150b.

The first contacts 150a and 150b and the second contact 160a in the layout shown in FIG. 1 form an H-shaped jumper. Therefore, when the IC 100A is actually manufactured, the IC 100A may be substantially the same as the IC 100A' that corresponds to the layout shown in FIG. 4. In other words, due to the H-shaped jumper in the layout shown in FIG. 1, the second conductive line 140b may be skipped.

Likewise, the first contacts 150a and 150b' and the second contact 160a in the layout shown in FIG. 2 may form an L-shaped jumper. Therefore, when the IC 100B is actually manufactured, the IC 100B may be substantially the same as the IC 100A' that corresponds to the layout shown in FIG. 4. In other words, due to the L-shaped jumper in the layout shown in FIG. 2, the second conductive line 140b may be skipped.

Figure 5:
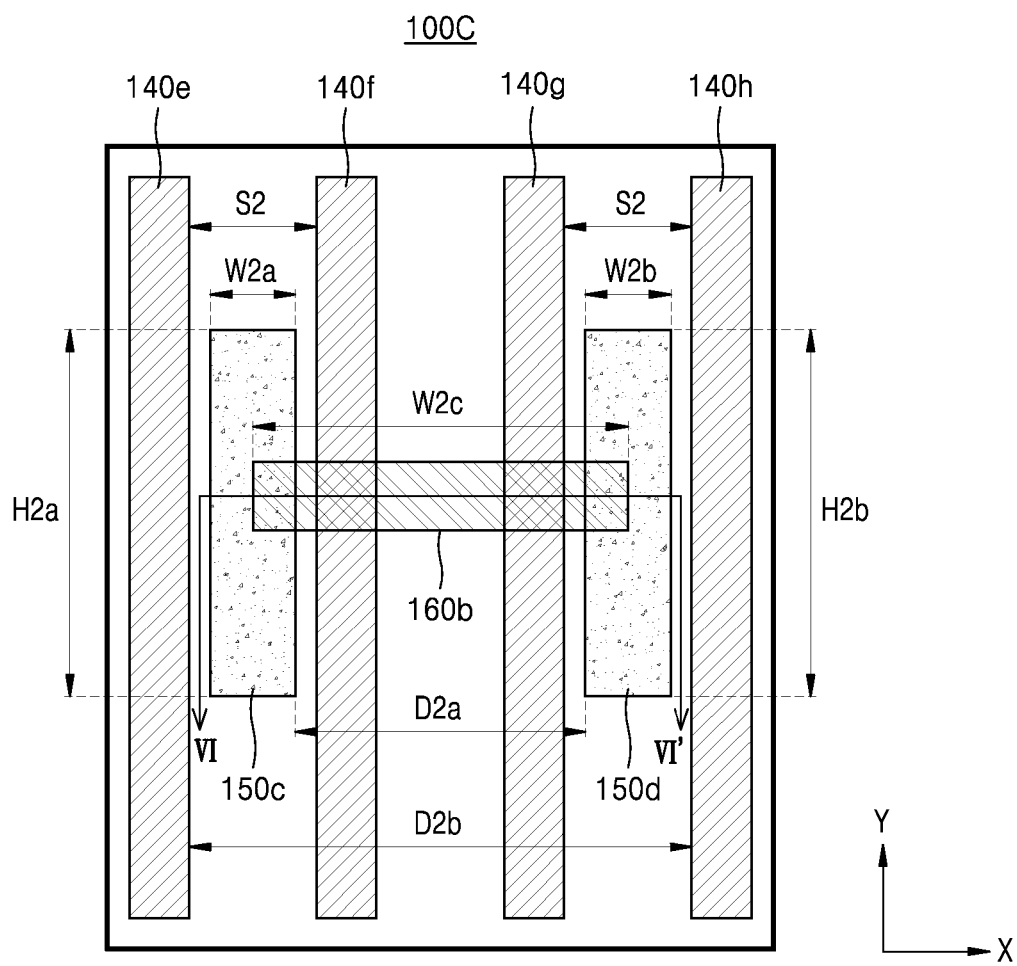
FIG. 5 is a layout illustrating a portion of an IC according to another example embodiment.

FIG. 5 is a layout illustrating a portion of an IC 100C according to other example embodiments.

Referring to FIG. 5, the IC 100C may include at least one cell defined by a cell boundary indicated with a bold line. The cell may include first to fourth conductive lines 140e to 140h, first contacts 150c and 150d, and a second contact 160b.

The first to fourth conductive lines 140e to 140h may extend in the first direction (e.g., the Y direction). Also, the first to fourth conductive lines 140e to 140h may be disposed in parallel to each other in the second direction (e.g., the X direction) that is substantially perpendicular to the first direction. The first to fourth conductive lines 140e to 140h may be formed of a material having electric conductivity, for example, polysilicon, metal, and/or metal alloy.

According to some example embodiments, the first to fourth conductive lines 140e to 140h may correspond to gate electrodes. However, example embodiments are not limited thereto. For example, the first to fourth conductive lines 140e to 140h may be conductive traces. Also, although FIG. 5 illustrates that the IC 100C includes the first to fourth conductive lines 140e to 140h, example embodiments are not limited thereto, for example, the IC 100C may include five or more conductive lines that extend in the first direction and are parallel to each other in the second direction.

The first contacts 150c and 150d may extend in the first direction. Also, the first contacts 150c and 150d may be disposed in parallel to each other in the second direction that is substantially perpendicular to the first direction. The first contacts 150c and 150d may be formed of a material having electric conductivity, for example, polysilicon, metal, and metal alloy. Accordingly, the first contacts 150c and 150d may provide a power voltage or a ground voltage to lower areas between the first to fourth conductive lines 140e to 140h.

According to some example embodiments, the first contacts 150c and 150d may include a first left contact 150c disposed at a left side of the second conductive line 140f and a first right contact 150d disposed at a right side of the third conductive line 140g. In other words, the first left contact 150c may be disposed between the first conductive line 140e and the second conductive line 140f, and the first right contact 150d may be disposed between the third conductive line 140g and the fourth conductive line 140h.

According to some example embodiments, a length of the first left contact 150c in the second direction, that is, a width W2a may be smaller than a space S2 between the first conductive line 140e and the second conductive line 140f. Likewise, a length of the first right contact 150d in the second direction, that is, a width W2b may be smaller than a space S2 between the third conductive line 140g and the fourth conductive line 140h. According to some example embodiments, the width W2a of the first left contact 150c may be substantially the same as the width W2b of the first right contact 150d. However, example embodiments are not limited thereto. For example, according to other example embodiments, the width W2a of the first left contact 150c may be different from the width W2b of the first right contact 150d.

The second contact 160b may be disposed on the second and third conductive lines 140f and 140g and the first contacts 150c and 150d, and form a single node by being electrically connected to the second and third conductive lines 140f and 140g and the first contacts 150c and 150d. Also, the second contact 160b may extend in the second direction, and accordingly, the second contact 160b may be disposed in a direction that horizontally crosses the second and third conductive lines 140f and 140g and the first contacts 150c and 150d. The second contact 160b may be formed of a material having electric conductivity, for example, polysilicon, metal, and/or metal alloy. Accordingly, the second contact 160b may provide, for example, an identical power voltage or an identical ground voltage to the second and third conductive lines 140f and 140g and the first contacts 150c and 150d.

According to some example embodiments, a length of the second contact 160b in the second direction, that is, a width W2c may be greater than a distance D2a between the first left contact 150c and the first right contact 150d and smaller than a distance D2b between the first conductive line 140e and the fourth conductive line 140h. Accordingly, the second contact 160b may be electrically connected to the second and third conductive lines 140f and 140g, the first left contact 150c, and the first right contact 150d, but not to the first and fourth conductive lines 140e and 140h.

According to some example embodiments, a length of the first left contact 150c in the first direction, that is, a height H2a, may be substantially the same as a length of the first right contact 150d in the first direction, that is, a height H2b. Accordingly, the first left contact 150c, the first right contact 150d, and the second contact 160b may form an H-shaped jumper. A jumper is a conducting wire having a relatively short length for connecting two points or two terminals in the IC 100C.

Although not illustrated, according to other example embodiments, the length of the first left contact 150*c* in the first direction, that is, the height H2*a*, may be different from the length of the first right contact 150*d* in the first direction, that is, the height H2*b*. Accordingly, the first left contact 150*c*, the first right contact 150*d*, and the second contact 160*b* may form an L-shaped jumper.

As described above, according to some example embodiments, a single node may be formed by electrically short-circuiting the second and third conductive lines 140*f* and 140*g*, the first contacts 150*c* and 150*d*, and the second contact 160*b*. Therefore, in the IC 100C manufactured based on the layout shown in FIG. 5, the second and third conductive lines 140*f* and 140*g* may be skipped. Thus, the H-shaped jumper according to some example embodiments may be referred to as a skip device.

Figure 6:
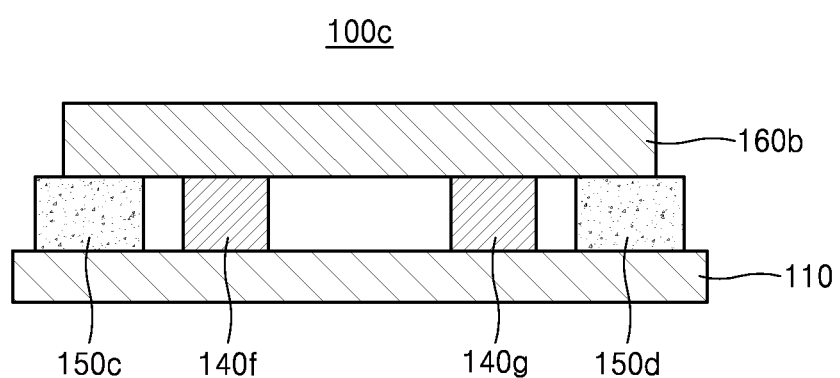
FIG. 6 is a cross-sectional view illustrating an example of a semiconductor device having the layout of FIG. 5.

FIG. 6 is a cross-sectional view illustrating an example of a semiconductor device 100*c* having the layout of FIG. 5.

Referring to FIG. 6, the semiconductor device 100*c* may include the substrate 110, the second and third conductive lines 140*f* and 140*g*, the first contacts 150*c* and 150*d*, and the second contact 160*b*. Although not illustrated, a voltage terminal providing, for example, a power voltage or a ground voltage may be additionally disposed on the second contact 160*b*.

The substrate 110 may be a semiconductor substrate that includes any one selected from, for example, silicon, SOI, silicon-on-sapphire, germanium, silicon-germanium, and gallium-arsenide. For example, the substrate 110 may be a P-type substrate. Also, although not illustrated, the substrate 110 may have an active region that is doped with impurities.

The second and third conductive lines 140*f* and 140*g* may be disposed on the substrate 110. According to some example embodiments, the second and third conductive lines 140*f* and 140*g* may be used as gate electrodes. In this case, a gate insulating layer may be additionally disposed between the second and third conductive lines 140*f* and 140*g* and the active region of the substrate 110.

The first contacts 150*c* and 150*d* may be disposed on the substrate 110. Therefore, the first contacts 150*c* and 150*d* may provide, for example, a power voltage or a ground voltage in the active region of the substrate 110. According to some example embodiments, the first contacts 150*c* and 150*d* may be respectively disposed at the left side of the second conductive line 140*f* and the right side of the third conductive line 140*g*. According to some example embodiments, upper portions of the first contacts 150*c* and 150*d* may be at a same level as upper portions of the second and third conductive lines 140*f* and 140*g*.

The second contact 160*b* may be disposed on and electrically connected to the second and third conductive lines 140*f* and 140*g* and the first contacts 150*c* and 150*d*. Accordingly, the second and third conductive lines 140*f* and 140*g*, the first contacts 150*c* and 150*d*, and the second contact 160*b* may form a single node.

Figure 7:
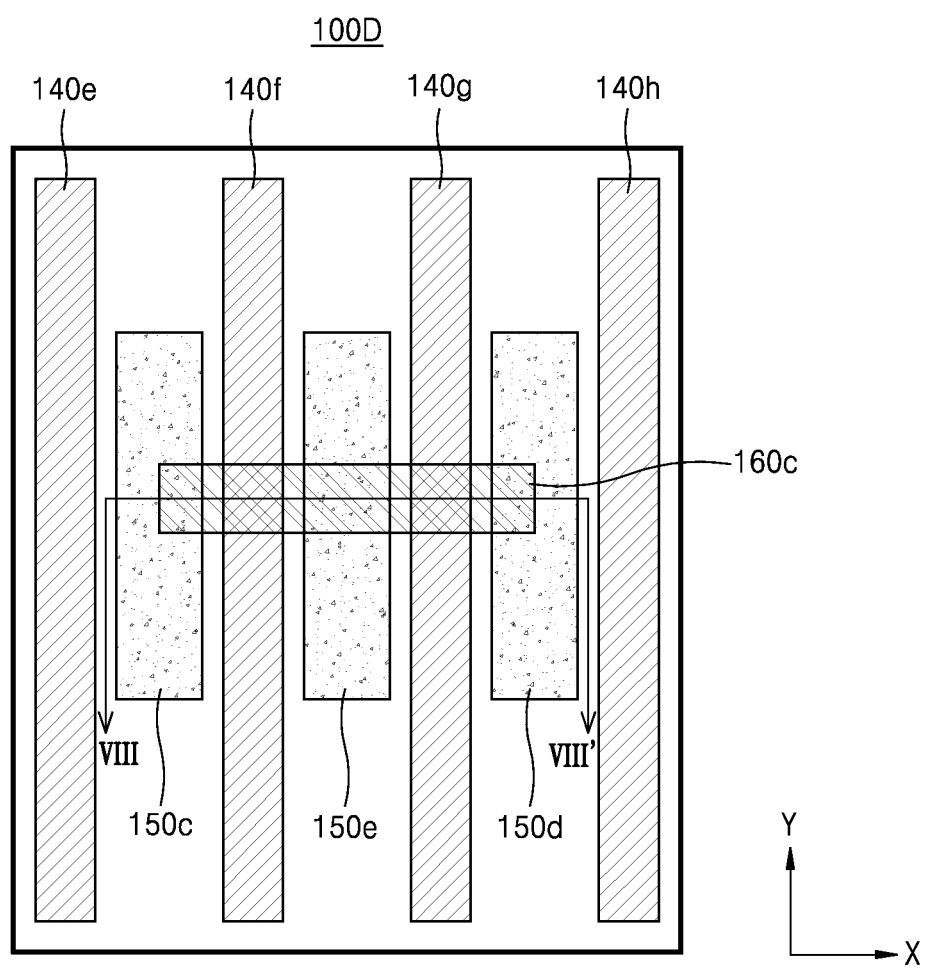
FIG. 7 is a layout illustrating a portion of an IC according to another example embodiment.

FIG. 7 is a layout illustrating a portion of an IC 100D according to other example embodiments.

Referring to FIG. 7, the IC 100D may include at least one cell defined by a cell boundary indicated with a bold line. The cell may include the first to fourth conductive lines 140*e* to 140*h*, the first left contact 150*c*, the first right contact 150*d*, a first central contact 150*e*, and a second contact 160*c*. The IC 100D is a modified example embodiment of the IC 100C shown in FIG, and thus, at least some of the descriptions of FIG. 5 may also be applied to the IC 100D. Therefore, features and elements already described with reference to FIG. 5 will not be repeated.

Unlike the IC 100C of FIG. 5, the IC 100D according to some example embodiments may further include the first central contact 150*e*. The first central contact 150*e* may be disposed between the second and third conductive lines 140*f* and 140*g*. According to some example embodiments, the second contact 160*c* may be electrically connected to the second and third conductive lines 140*f* and 140*g* and the first left, right, and central contacts 150*c*, 150*d*, and 150*e* and thus form a single node.

Figure 8:
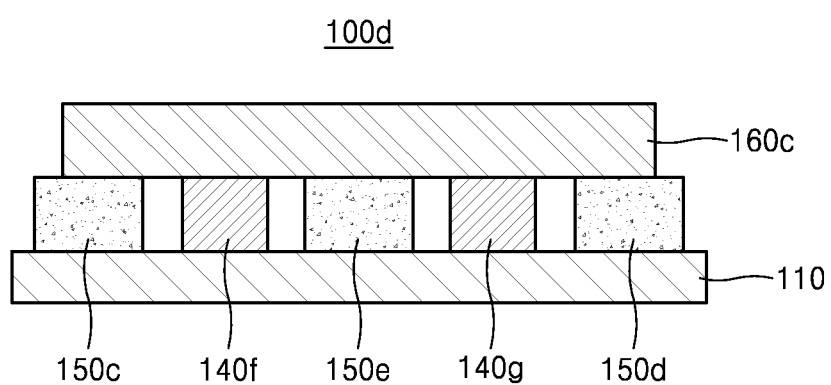
FIG. 8 is a cross-sectional view illustrating an example of a semiconductor device having the layout of FIG. 5, cut along line VIII-VIII' of FIG. 7.

FIG. 8 is a cross-sectional view illustrating an example of a semiconductor device 100*d* having the layout of FIG. 5, cut along line VIII-VIII' of FIG. 7;

Referring to FIG. 8, the semiconductor device 100*d* may include the substrate 110, second and third conductive lines 140*f* and 140*g*, the first left 150*c*, right 150*d*, and central 150*e* contacts, and the second contact 160*c*. The semiconductor device 100*d* is a modified embodiment of the semiconductor device 100*c* of FIG. 6, and, therefore, the descriptions of FIG. 6 may also be applied to the semiconductor device 100*d*. Therefore, features and elements already described with reference to FIG. 6 will not be repeated.

The first left, right, and central contacts 150*c*, 150*d*, and 150*e*, respectively, may be disposed on the substrate 110. Therefore, the first left contact 150*c*, first right contact 150*d*, and first central contact 150*e* may provide, for example, a power voltage or a ground voltage to the active region of the substrate 110. According to some example embodiments, the first central contact 150*e* may be disposed between the second and third conductive lines 140*f* and 140*g*. According to some example embodiments, upper portions of the first left, right, and central contacts 150*c*, 150*d*, and 150*e*, respectively, may be at a substantially same level as the upper portions of the second and third conductive lines 140*f* and 140*g*, respectively.

The second contact 160*c* may disposed on and electrically connected to the second and third conductive lines 140*f* and 140*g* and the first left, right, and central contacts 150*c*, 150*d*, and 150*e*. Accordingly, the second and third conductive lines 140*f* and 140*g*, the first left, right, and central contacts 150*c*, 150*d*, and 150*e*, respectively, and the second contact 160*b* may form a single node.

Figure 9:
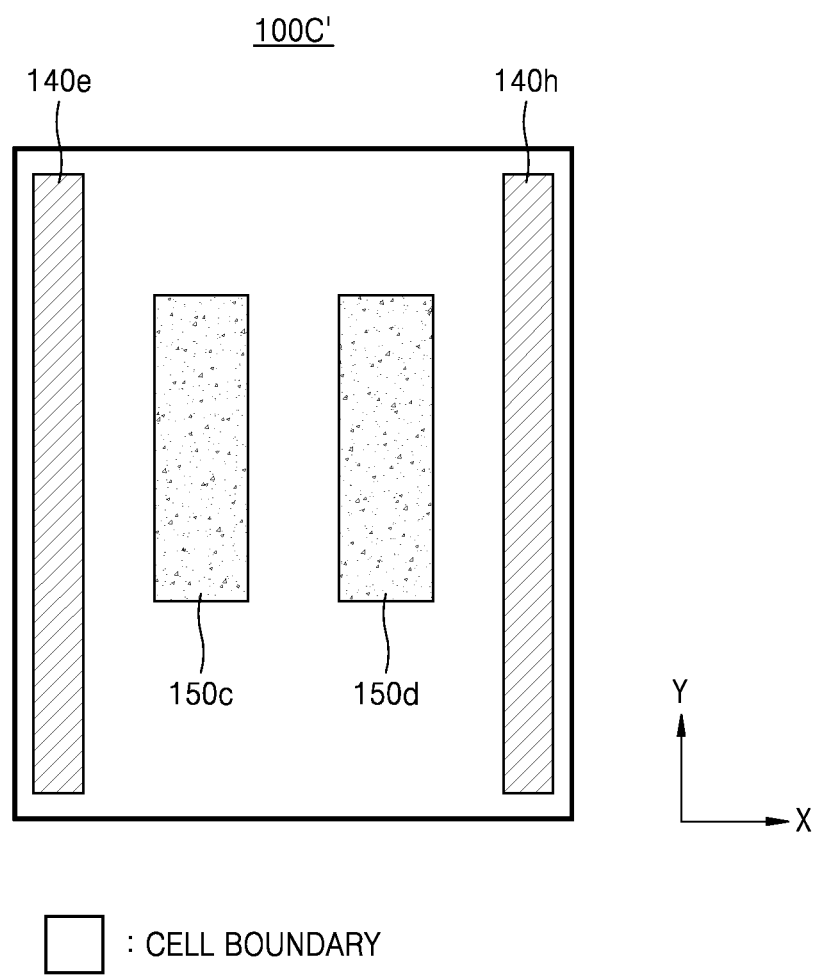
FIG. 9 is a layout illustrating a portion of an IC that is substantially the same as the example embodiment of FIG. 5.

FIG. 9 is a layout illustrating a portion of an IC 100C' that is substantially the same as the example embodiment of FIG. 5.

Referring to FIG. 9, the IC 100C' may include the first and fourth conductive lines 140*e* and 140*h* and the first contacts 150*c* and 150*d*. The first contacts 150*c* and 150*d* may be connected to an identical metal line disposed above the first contacts 150*c* and 150*d*. According to other example embodiments, the IC 100C' may include only one of the first contacts 150*c* and 150*d*.

The first contacts 150*c* and 150*d* and the second contact 160*b* included in the layout shown in FIG. 5 may form an H-shaped jumper. Therefore, when the IC 100C is actually manufactured, the IC 100C may be substantially the same as the IC 100C' that corresponds to the layout shown in FIG. 9. In other words, due to the H-shaped jumper in the layout shown in FIG. 5, the second and third conductive lines 140*f* and 140*g* may be skipped.

Likewise, the first left, right, and central contacts 150*c*, 150*d*, and 150*e* and the second contact 160*c* in the layout shown in FIG. 7 may form a jumper. Therefore, when the IC 100D is actually manufactured, the IC 100D may be substantially the same as the IC 100C' that corresponds to the layout shown in FIG. 9. In other words, due to the jumper in the layout shown in FIG. 7, the second and third conductive lines 140*f* and 140*g* may be skipped.

Figure 10:
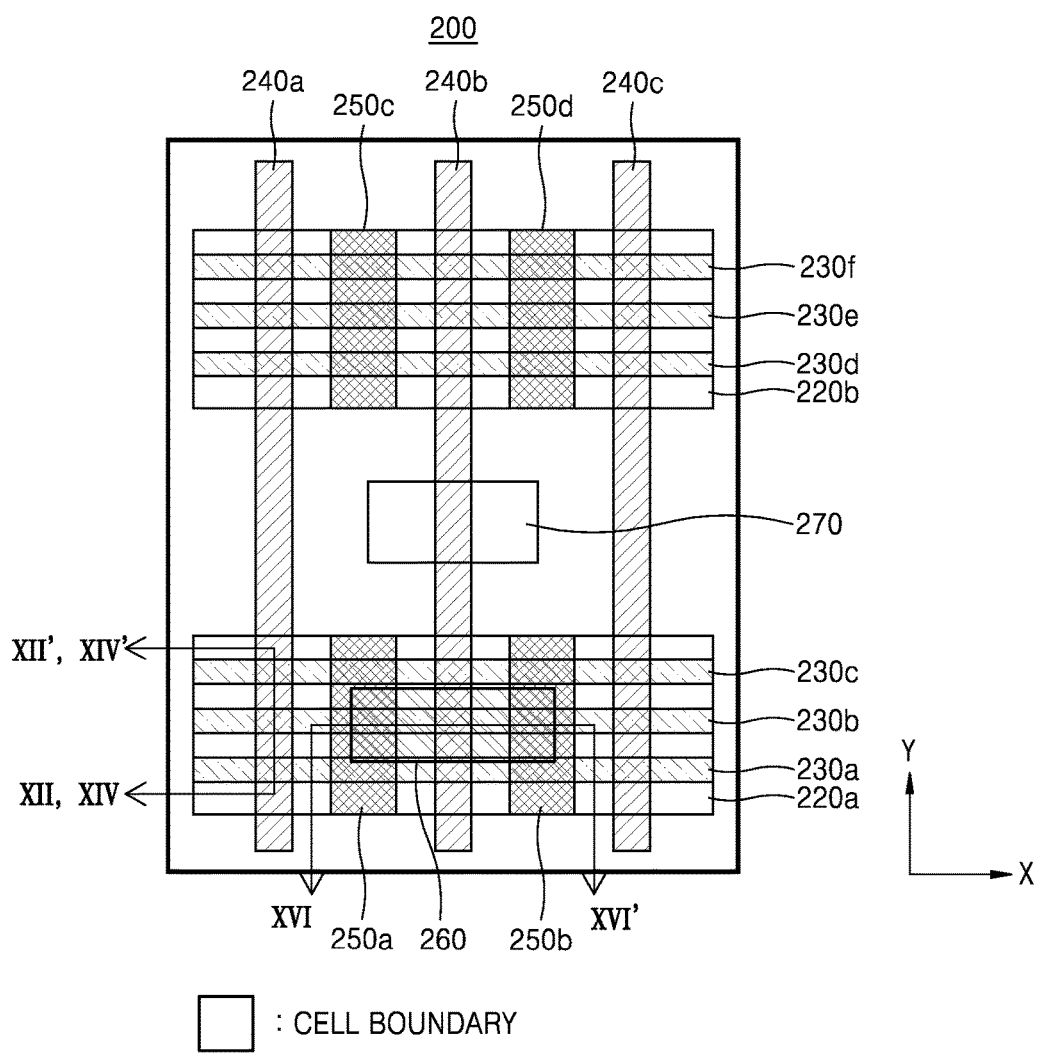
FIG. 10 is a layout illustrating an IC according to another example embodiment.

FIG. 10 is a layout illustrating an IC 200 according to other example embodiments.

Referring to FIG. 10, the IC 200 may include at least one cell defined by a cell boundary drawn with a bold line. Specifically, FIG. 10 illustrates an example of a standard cell in the IC 200. The standard cell includes, but is not limited to, first and second active regions 220a and 220b, a plurality of fins, a plurality of conductive lines, first contacts 250a to 250d, a second contact 260, and a cutting region 270.

According to some example embodiments, the plurality of fins may include first to sixth fins 230a to 230f and the plurality of conductive lines may include first to third conductive lines 240a to 240c. However, example embodiments are not limited thereto. For example, according to other example embodiment, the plurality of fins and the plurality of conductive lines may include various numbers of fins and conductive lines, respectively.

The first active region 220a may be where the first to third fins 230a to 230c are disposed, for example, an N-type metal oxide semiconductor (NMOS) defining layer. For example, the first active region 220a may be a random area in a P-type substrate. The second active region 220b may be where the fourth to sixth fins 230d to 230f are disposed, for example, a P-type MOS (PMOS) defining layer. For example, the second active region 220b may be an N-well region. Although not illustrated, a device separation region may be disposed between the first active region 220a and the second active region 220b.

The first to sixth fins 230a to 230f may be disposed in parallel to each other in the first direction (e.g., the Y direction) and extend in the second direction (e.g., the X direction) that is substantially perpendicular to the first direction. According to some example embodiments, the first to sixth fins 230a to 230f may be active fins. A channel width of a fin transistor formed by such fins may increase in proportion to the number of active fins, and accordingly, an amount of current flowing in the fin transistor may increase. Although not illustrated, the IC 200 may additionally include a dummy fin disposed on the device separation region.

According to some example embodiments, in the layout of the IC 200, the first to sixth fins 230a to 230f may have the same respective lengths in the first direction, i.e., respective widths. The respective widths of the first to sixth fins 230a to 230f are widths 2-dimensionally shown on the layout of FIG. 10. Since FIG. 10 is a 2D layout, respective heights of the first to sixth fins 230a to 230f are not shown.

The first to third conductive lines 240a to 240c may extend in the first direction (e.g., the Y direction). Also, the first to third conductive lines 240a to 240c may be disposed in parallel to each other in the second direction (e.g., the X direction) that is substantially perpendicular to the first direction. The first to third conductive lines 240a to 240c may be formed of a material having electric conductivity, for example, polysilicon, metal, and/or metal alloy. According to some example embodiments, the first to third conductive lines 240a to 240c may correspond to gate electrodes.

The first contacts 250a to 250d may extend in the first direction (e.g., the Y direction). Also, the first contacts 250a to 250d may be disposed in parallel to each other in the second direction (e.g., the X direction) that is substantially perpendicular to the first direction. The first contacts 250a to 250d may be formed of a material having electric conductivity, for example, polysilicon, metal, and/or metal alloy.

According to some example embodiments, the first contacts 250a to 250d may include first lower contacts 250a and 250b on the first active region 220a and first upper contacts 250c and 250d on the second active region 220b. The first lower contacts 250a and 250b may be contacts connected to the first active region 220a, for example, source and drain contacts. Therefore, the first lower contacts 250a and 250b may provide, for example, a power voltage or a ground voltage to the first active region 220a. The first upper contacts 250c and 250d may be contacts connected to the second active region 220b, for example, source and drain contacts. Therefore, the first upper contacts 250c and 250d may provide, for example, a power voltage or a ground voltage to the second active region 220b.

According to some example embodiments, the first lower contacts 250a and 250b may respectively be disposed at two sides of the second conductive line 240b. In particular, the first lower contacts 250a and 250b may include a first lower left contact 250a disposed at a left side of the second conductive line 240b and a first lower right contact 250b disposed at a right side of the second conductive line 240b. In other words, the first lower left contact 250a may be disposed between the first and second conductive lines 240a and 240b, and the first lower right contact 250b may be disposed between the second and third conductive lines 240b and 240c.

The second contact 260 may be disposed on the second conductive line 240b and the first lower contacts 250a and 250b, and form a single node by being electrically connected to the second conductive line 240b and the first lower contacts 250a and 250b. Also, the second contact 260 may extend in the second direction, that is, in and accordingly, the second contact 260 may be disposed in a direction that horizontally crosses the second conductive line 240b and the first lower contacts 250a and 250b. The second contact 260 may be formed of a material having electric conductivity, for example, polysilicon, metal, and/or metal alloy. Therefore, the second contact 260 may provide, for example, an identical power voltage or an identical ground voltage to the second conductive line 240b and the first lower contacts 250a and 250b.

According to some example embodiments, the first to third conductive lines 240a to 240c, the first lower contacts 250a and 250b, and the second contact 260 disposed on the first active region 220a may be substantially the same as IC 100A illustrated in FIG. 1. Therefore, the description of FIG. 1 may also be applied to the IC 200, and features and elements already described with reference to FIG. 1 will not be repeated.

As described above, according to some example embodiments, a single node may be formed by electrically short-circuiting the second conductive line 240b, the first lower contacts 250a and 250b, and the second contact 260 on the first active region 220a. Therefore, in the IC 200 manufactured based on the layout shown in FIG. 10, the second conductive line 240b may be skipped in the first active region 220a but not skipped in the second active region 220b. Therefore, the IC 200 may include an asymmetrical gate in which two transistors, for example, two NMOS fin transistors, are in the first active region 220a, and three transistors, for example, three PMOS fin transistors, are in the second active region 220b.

Although FIG. 10 illustrates an example embodiment in which the second contact 260 is disposed on the first active region 220a, example embodiments are not limited thereto. For example, according to other example embodiments, the second contact 260 may be disposed on both of the first and second active regions 220a and 220b. In this case, the same number of transistors may be disposed on the first and second active regions 220a and 220b. According to other example embodiments, the second contact 260 may be disposed only on the second active region 220b. In this case, more transistors may be disposed on the first active region 220a than on the second active region 220b.

Figure 11:
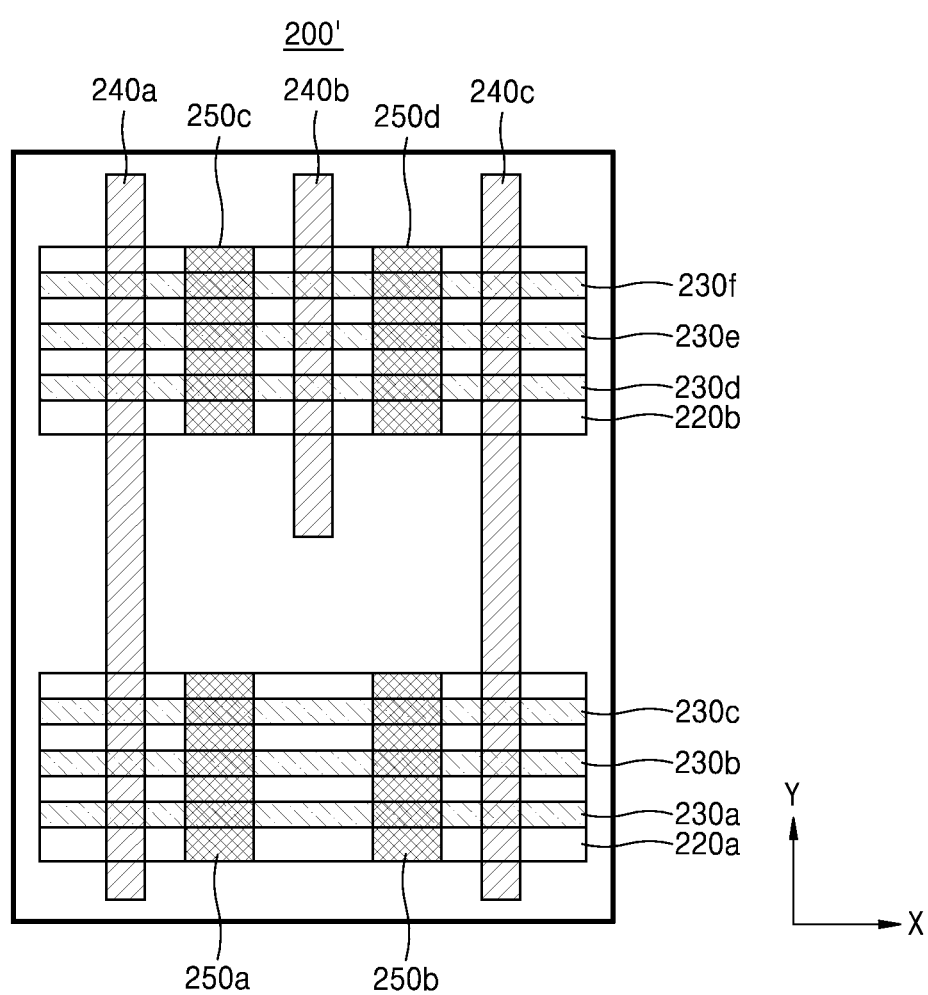
FIG. 11 is a layout illustrating an IC that is substantially the same as the example embodiment of FIG. 10.

FIG. 11 is a layout illustrating an IC 200' that is substantially the same as the example embodiments of FIG. 10.

Referring to FIG. 11, the IC 200' may include the first to third conductive lines 240a to 240c and the first contacts 250a to 250d. The first lower contacts 250a and 250b disposed on the first active region 220a may be connected to an identical metal line above the first lower contacts 250a and 250b. According to other example embodiments, the IC 200' may include only one of the first lower contacts 250a and 250b.

The first lower contacts 250a and 250b and the second contact 260 included in the layout shown in FIG. 10 may form an H-shaped jumper. Therefore, when the IC 200 is actually manufactured, the IC 200 may be substantially the same as the IC 200' that corresponds to the layout shown in FIG. 11. In other words, due to the H-shaped jumper in the layout shown in FIG. 10, the second conductive line 240b in the first active region 220a may be skipped. Therefore, as illustrated in FIG. 11, the second conductive line 240b may be skipped in the first active region 220a, and, thus, the ICs 200 and 200' may include two NMOS fin transistors in the first active region 220a, and three PMOS fin transistors in the second active region 220b.

Figure 12:
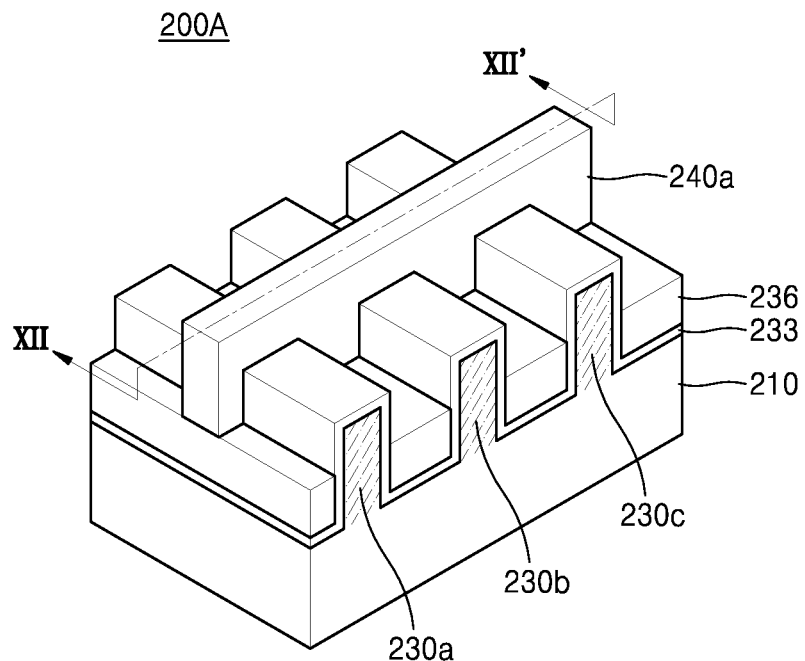
FIG. 12 is a perspective view illustrating an example of a semiconductor device having the layout of FIG. 10.
Figure 13:
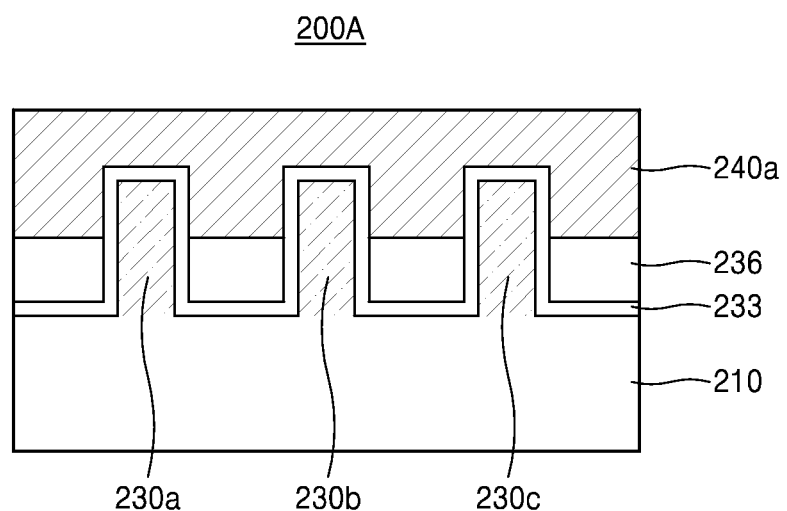
FIG. 13 is a cross-sectional view illustrating the semiconductor device cut along line XII-XII' of FIG. 12.

FIG. 12 is a perspective view illustrating an example of a semiconductor device 200A having the layout of FIG. 10. FIG. 13 is a cross-sectional view illustrating the semiconductor device 200A cut along line XII-XII' of FIG. 12.

Referring to FIGS. 12 and 13, the semiconductor device 200A may be a bulk type fin transistor. The semiconductor device 200A may include a substrate 210, a first insulating layer 233, a second insulating layer 236, the first to third fins 230a to 230c, and the first conductive line (hereinafter referred to as a 'gate electrode') 240a.

The substrate 210 may be a semiconductor substrate that includes any one selected from, for example, silicon, SOI, silicon-on-sapphire, germanium, silicon-germanium, and gallium-arsenide. The substrate 210 may be a P-type substrate and used as the first active region 220a.

The first to third fins 230a to 230c may be disposed such that they are connected to the substrate 210. According to some example embodiments, the first to third fins 230a to 230c may be active regions formed by doping portions vertically protruding from the substrate 210 with n+ or p+ impurities.

The first and second insulating layers 233 and 236 may include an insulating material selected from, for example, an oxide, a nitride, and/or an oxynitride. The first insulating layer 233 may be disposed on the first to third fins 230a to 230c. The first insulating layer 233 may be used as a gate insulating layer by being disposed between the first to third fins 230a to 230c and the gate electrode 240a. The second insulating layer 236 may be formed at spaces between the first to third fins 230a to 230c to a certain height. The second insulating layer 236 may be used as a device separation layer by being disposed between the first to third fins 230a to 230c.

The gate electrode 240a may be disposed on the first and second insulating layers 233 and 236. Accordingly, the gate electrode 240a may surround the first to third fins 230a to 230c, the first insulating layer 233, and the second insulating layer 236. In other words, the first to third fins 230a to 230c may be located inside the gate electrode 240a. The gate electrode 240a may include a metallic material such as tungsten (W) or tantalum (Ta), a nitride of the metallic material, a silicide of the metallic material, and/or a doped polysilicon, and formed by using deposition processes.

Figure 14:
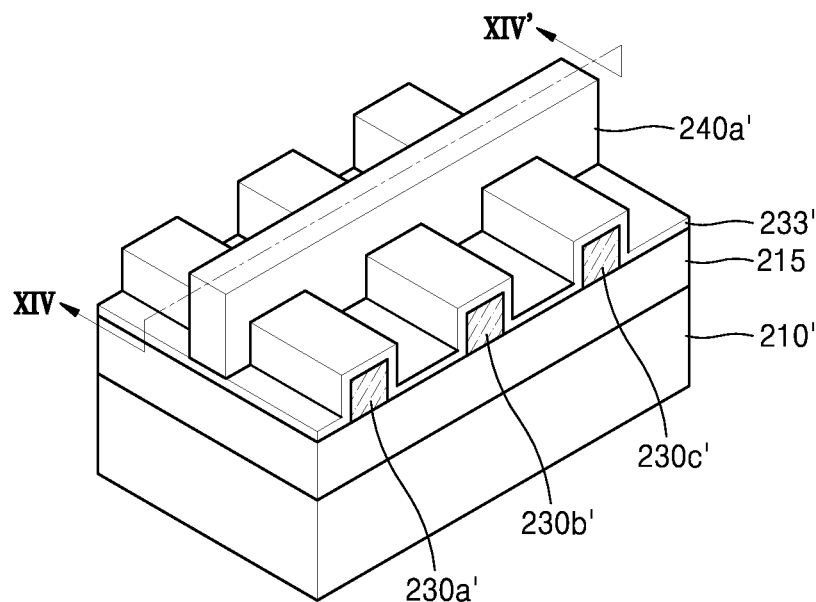
FIG. 14 is a perspective view illustrating another example of a semiconductor device having the layout of FIG. 10.
Figure 15:
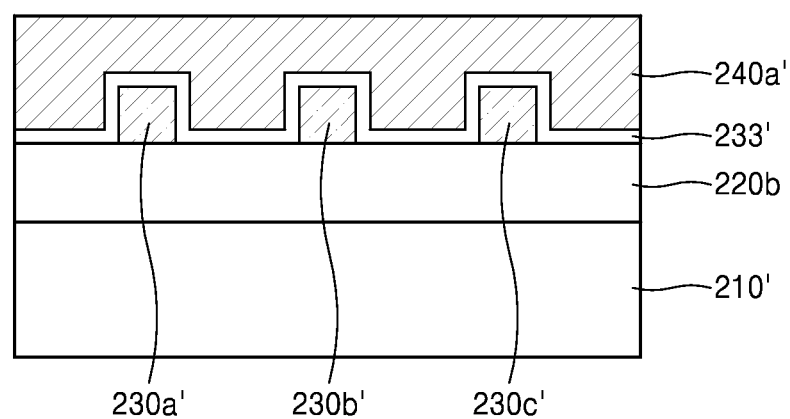
FIG. 15 is a cross-sectional view illustrating the semiconductor device cut along line XIV-XIV' of FIG. 14.

FIG. 14 is a perspective view illustrating another example of a semiconductor device 200B having the layout of FIG. 10. FIG. 15 is a cross-sectional view illustrating the semiconductor device 200B cut along line XIV-XIV' of FIG. 14.

Referring to FIGS. 14 and 15, the semiconductor device 200B may be an SOI type fin transistor. The semiconductor device 200B may include a substrate 210', a first insulating layer 215, a second insulating layer 233', first to third fins 230a' to 230c', and a first conductive line (hereinafter referred to as 'gate electrode') 240a'. The semiconductor device 200B is a modified example embodiment of the semiconductor device 200A shown in FIGS. 12 and 13. Therefore, features and elements of the semiconductor 200B that are different from the semiconductor device 200A will be mainly described, and features and elements already described with reference to FIGS. 12 and 13 will not be repeated.

The first insulating layer 215 may be disposed on the substrate 210'. The second insulating layer 233' may be used as a gate insulating layer by being disposed between the first to third fins 230a' to 230c' and the gate electrode 240a'. The first to third fins 230a' to 230c' may include a semiconductor material, for example, silicon and/or doped silicon.

The gate electrode 240a' may be disposed on the second insulating layer 233'. Therefore, the gate electrode 240a' may surround the first to third fins 230a' to 230c' and the second insulating layer 233'. In other words, the first to third fins 230a' to 230c' may be located inside the gate electrode 240a'.

Figure 16:
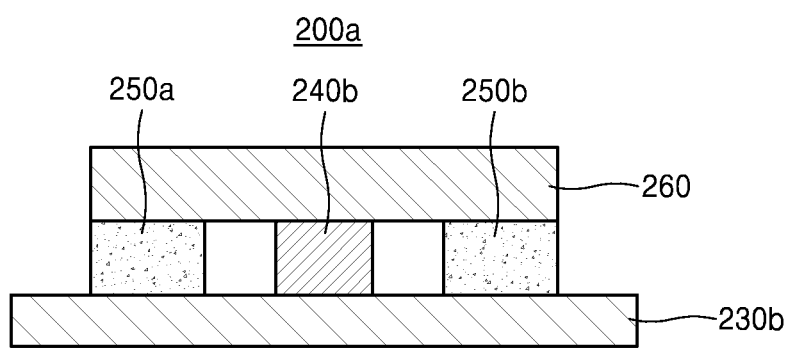
FIG. 16 is a cross-sectional view illustrating a semiconductor device having the layout of FIG. 10, cut along line XVI-XVI' of FIG. 10.

FIG. 16 is a cross-sectional view illustrating a semiconductor device 200a having the layout of FIG. 10, cut along line XVI-XVI' of FIG. 10.

Referring to FIG. 16, the semiconductor device 200A may include the second fin 230b, the second conductive line 240b, the first lower contacts 250a and 250b, and the second contact 260. Although not illustrated, a voltage terminal providing, for example, a power voltage or a ground voltage may be additionally disposed on the second contact 260.

The second conductive line 240b may be disposed on the second fin 230b. According to some example embodiments, the second conductive line 240b may be used as a gate electrode, and a gate insulating layer may be additionally disposed between the second conductive line 240b and the second fin 230b.

The first lower contacts 250a and 250b may be disposed on the second fin 230b. Therefore, the first lower contacts 250a and 250b may provide, for example, a power voltage or a ground voltage to the second fin 230b. According to some example embodiments, the first lower contacts 250a and 250b may respectively be disposed at two sides of the second conductive line 240b. According to some example embodiments, upper portions of the first lower contacts 250a and 250b may be at a same level as an upper portion of the second conductive line 240b.

The second contact 260 may be disposed on and electrically connected to the second conductive line 240b and the first lower contacts 250a and 250b. Accordingly, the second conductive line 240b, the first lower contacts 250a and 250b, and the second contact 260 may form a single node.

Figure 17:
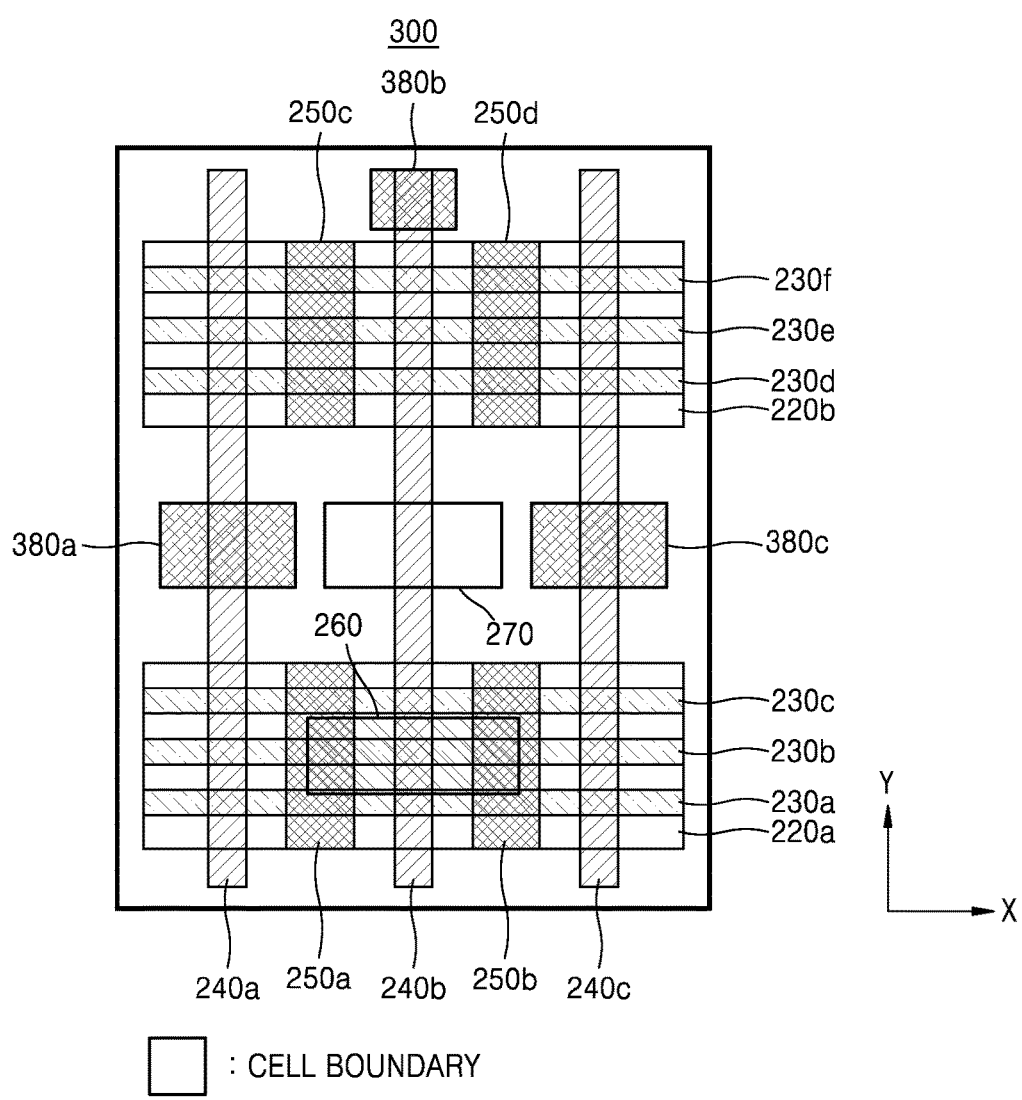
FIG. 17 is a layout illustrating an IC according to another example embodiment.

FIG. 17 is a layout illustrating an IC 300 according to other example embodiments.

Referring to FIG. 17, the IC 300 may include at least one cell defined by a cell boundary drawn with a bold line. Specifically, FIG. 17 illustrates an example of a standard cell in the IC 300. The standard cell may include the first and second active regions 220a and 220b, the first to sixth fins 230a to 230f, the first to third conductive lines 240a to 240c, the first contacts 250a to 250d, the second contact 260, the cutting region 270, and third contacts 380a to 380c. The IC 300 is a modified example embodiment of the IC 200 shown in FIG. 10. Therefore, the descriptions of FIG. 10 may also be applied to the IC 300, and, thus, features and elements already described with reference to FIG. 10 will not be repeated.

In comparison to the IC 200 of FIG. 10, the IC 300 according to some example embodiments may additionally include the third contacts 380a to 380c. A first one of the third contacts 380a may be disposed on and electrically connected to the first conductive line 240a. A third one of the third contacts 380c may be disposed on and electrically connected to the third conductive line 240c.

A second one of the third contacts 380b may be disposed on and electrically connected to the second conductive line 240b. Since the cutting region 270 is in the middle of the second conductive line 240b, the third contact 380b is electrically connected to only the second conductive line 240b on the second active region 220b, but not to the second conductive line 240b of the first active region 220a.

According to some example embodiments, a single node may be formed by electrically short-circuiting the second conductive line 240b, the first lower contacts 250a and 250b, and the second contact 260 on the first active region 220a. Therefore, in the IC 300 manufactured based on the layout shown in FIG. 17, the second conductive line 240b may be skipped in the first active region 220a but not skipped in the second active region 220b such that the IC 300 has an asymmetrical gate. Therefore, the IC 300 may include two transistors, for example, two NMOS fin transistors, in the first active region 220a, and three transistors, for example, three PMOS fin transistors, in the second active region 220b.

Although FIG. 17 illustrates an example embodiment in which the second contact 260 is disposed on the first active region 220a, example embodiments are not limited thereto. For example, according to other example embodiments, the second contact 260 may be disposed on both of the first and second active regions 220a and 220b. In this case, the same number of transistors may be disposed on the first and second active regions 220a and 220b. According to other example embodiments, the second contact 260 may be disposed only on the second active region 220b. In this case, more transistors may be disposed on the first active region 220a than on the second active region 220b.

Figure 18:
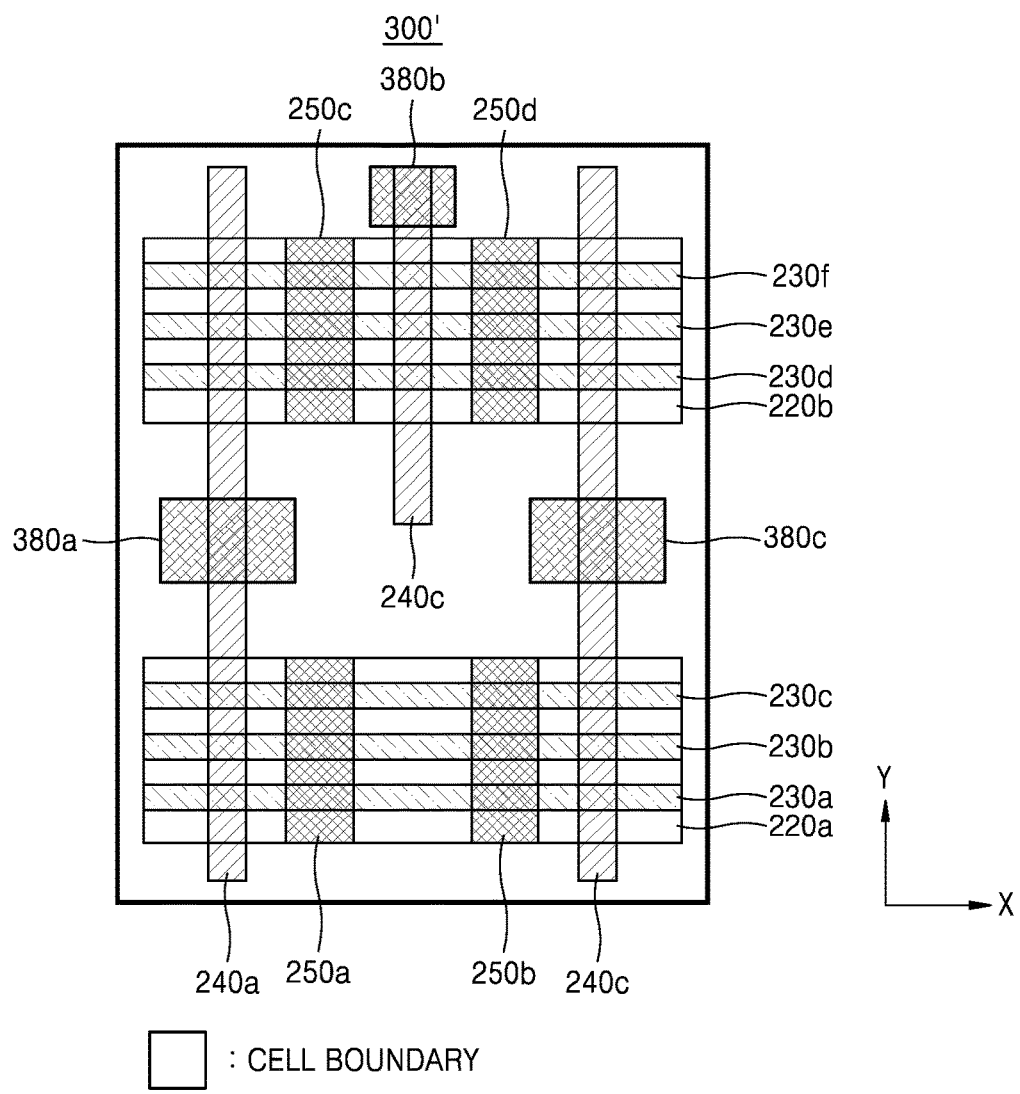
FIG. 18 is a layout illustrating a portion of an IC that is substantially the same as the example embodiment of FIG. 17.

FIG. 18 is a layout illustrating a portion of an IC 300' that is substantially the same as the example embodiment of FIG. 17.

Referring to FIG. 18, the IC 300' may include the first to third conductive lines 240a to 240c, the first contacts 250a to 250d, and the third contacts 380a to 380c. The first lower contacts 250a and 250b on the first active region 220a may be connected to an identical metal line above the first lower contacts 250a and 250b. According to other example embodiments, the IC 300' may include only one of the first lower contacts 250a and 250b.

The first lower contacts 250a and 250b and the second contact 260 included in the layout shown in FIG. 17 may form an H-shaped jumper. Therefore, when the IC 300 is actually manufactured, the IC 300 may be substantially the same as the IC 300' that corresponds to the layout shown in FIG. 18. In other words, as shown in FIG. 18, due to the H-shaped jumper in the layout shown in FIG. 17, the second conductive line 240b in the first active region 220a may be skipped. Therefore, the ICs 300 and 300' may include two NMOS fin transistors in the first active region 220a, and three PMOS fin transistors in the second active region 220b.

Figure 19:
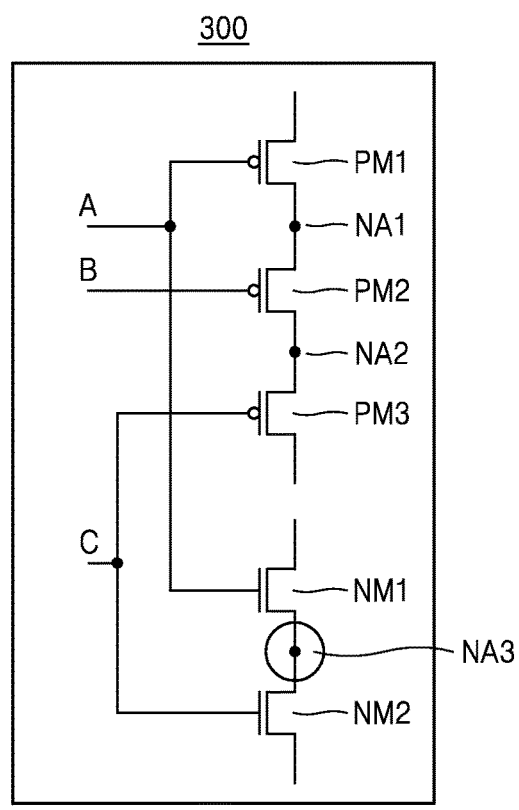
FIG. 19 is a circuit diagram illustrating the IC of FIG. 17.

FIG. 19 is a circuit diagram illustrating the IC 300 of FIG. 17.

Referring to FIGS. 17 and 19, the IC 300 may include first to third PMOS fin transistors PM1 to PM3 and first and second NMOS fin transistors NM1 and NM2. The first to third PMOS fin transistors PM1 to PM3 may be formed on the second active region 220b, and the first and second NMOS fin transistors NM1 and NM2 may be formed on the first active region 220a.

Respective gates of the first PMOS fin transistor PM1 and the first NMOS fin transistor NM1 are both connected to a node A that may correspond to the first one of the third contacts 380a. Also, a gate of the second PMOS fin transistor PM2 may be connected to a node B that may correspond to the second one of the third contacts 380b. Also, respective gates of the third PMOS fin transistor PM3 and the second NMOS fin transistor NM2 may both be connected to a node C that may correspond to the third one of the third contacts 380c.

Specifically, in some example embodiments, the gate of the first PMOS fin transistor PM1 may be connected to the third contact 380a, a drain of the first PMOS fin transistor PM1 may be connected to the first node area NA1, and the first node area NA1 may correspond to a first left upper contact 250c. The gate of the second PMOS fin transistor PM2 may be connected to the third contact 380b, a drain of the second PMOS fin transistor PM2 may be connected to a second node area NA2, and the second node area NA2 may correspond to a first right upper contact 250d. The gate of the third PMOS fin transistor PM3 may be connected to the third one of the third contacts 380c.

The gate of the first NMOS fin transistor NM1 may be connected to the first one of the third contacts 380a, and the gate of the second NMOS fin transistor NM2 may be connected to the third one of the third contacts 380c. The first and second NMOS fin transistors NM1 and NM2 may be connected to a third node area NA3 that may correspond to a jumper formed by the first lower contacts 250a and 250b and the second contact 260 of FIG. 17.

Figure 20:
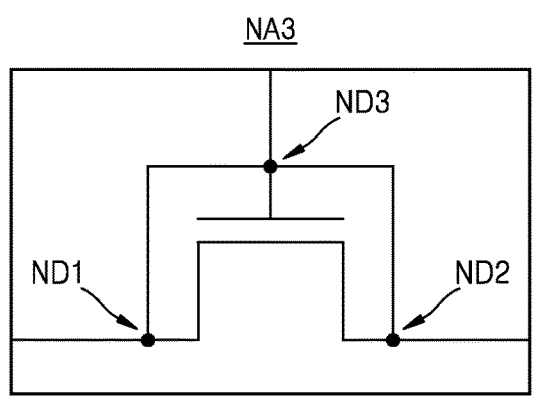
FIG. 20 is a circuit diagram illustrating a third node area of FIG. 19 in detail.

FIG. 20 is a circuit diagram illustrating the third node area NA3 of FIG. 19 in detail.

Referring to FIGS. 17, 19 and 20, a single node area, that is, the third node area NA3 may be formed by connecting a first node ND1 between the second fin 230b and the first lower left contact 250a, a second node ND2 between the second fin 230b and the first lower right contact 250b, and a third node ND3 between the second contact 260 and the second conductive line 240b.

Figure 21:
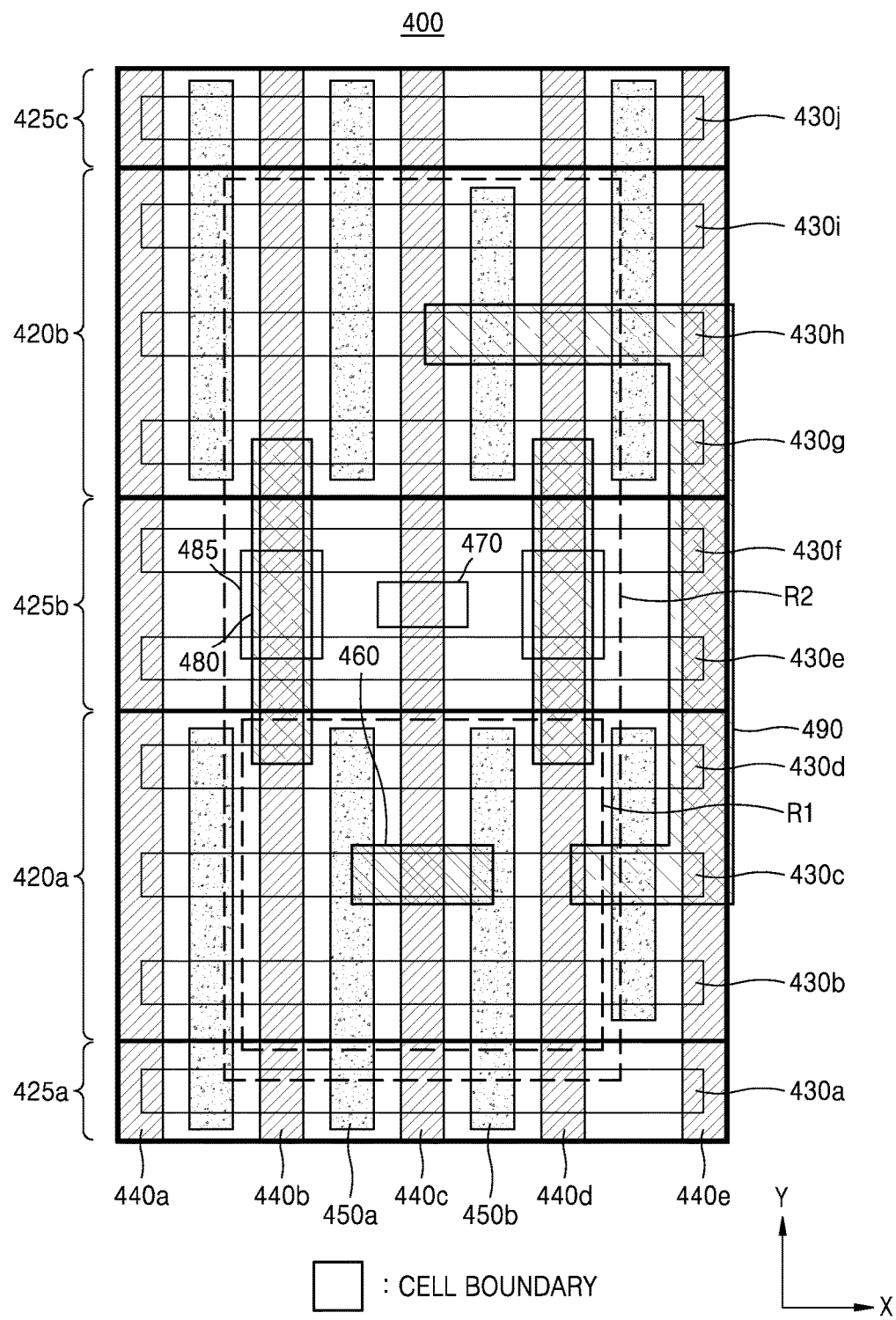
FIG. 21 is a layout illustrating an IC according to another example embodiment.

FIG. 21 is a layout illustrating an IC 400 according to other example embodiments.

Referring to FIG. 21, the IC 400 may include at least one cell defined by a cell boundary drawn with a bold line. Specifically, FIG. 21 illustrates an example of a standard cell in the IC 400. The standard cell may include first to tenth fins 430a to 430j, a plurality of gate electrodes 440b, 440c, and 440d, a plurality of dummy gate electrodes 440a and 440e, a plurality of source and drain contacts 450a and 450b, a second contact 460, a cutting region 470, two input terminals 480, two input contacts 485, and an output terminal 490.

According to example embodiments, the first, fifth, sixth, and tenth fins 430a, 430e, 430f, and 430j may be dummy fins, and the second to fourth and seventh to ninth fins 430b to 430d and 430g to 430i may be active fins. Specifically, the second to fourth fins 430b to 430d may be disposed in a first active region 420a, and the seventh to ninth fins 430g to 430i may be disposed in a second active region 420b. The first fin 430a may be disposed in a first device separation region 425a, the fifth and sixth fins 430e and 430f may be disposed in a second device separation region 425b, and the tenth fin 430j may be disposed in the third device separation region 425c.

First, the first to tenth fins 430a to 430j may be formed on a semiconductor substrate (not shown) in advance by performing a single manufacturing process. Second, the plurality of source and drain contacts 450a and 450b and gate electrodes including the plurality of gate electrodes 440b, 440c, and 440d and the plurality of dummy gate electrodes 440a and 440e may be formed. Third, the second contact 460 may be formed on the gate electrode 440c and the plurality of source and drain contacts 450a and 450b. Fourth, the two input terminals 480 and the output terminal 490 may be formed.

A first region R1 is similar to the layout shown in FIG. 1, and, therefore, the example embodiments described above with reference to FIGS. 1 to 9 may be applied to the first region R1. A second region R2 is similar to the layout shown in FIG. 10, and, therefore, the example embodiments described above with reference to FIGS. 10 to 20 may be applied to the second region R2. According to some example embodiments, the second to fourth fins 430b to 430d may form an NMOS transistor, and the seventh to ninth fins 430g to 430i may form a PMOS transistor.

Although FIG. 21 illustrates an example embodiment in which the second contact 460 is disposed on the first active region 420a, example embodiments are not limited thereto. For example, according to other example embodiments, the second contact 460 may be disposed on both of the first and second active regions 420a and 420b. In this case, the same number of transistors may be disposed on the first and second active regions 420a and 420b. According to other example embodiments, the second contact 460 may be disposed only on the second active region 420b. In this case, more transistors may be disposed on the first active region 220a than on the second active region 220b.

Figure 22:
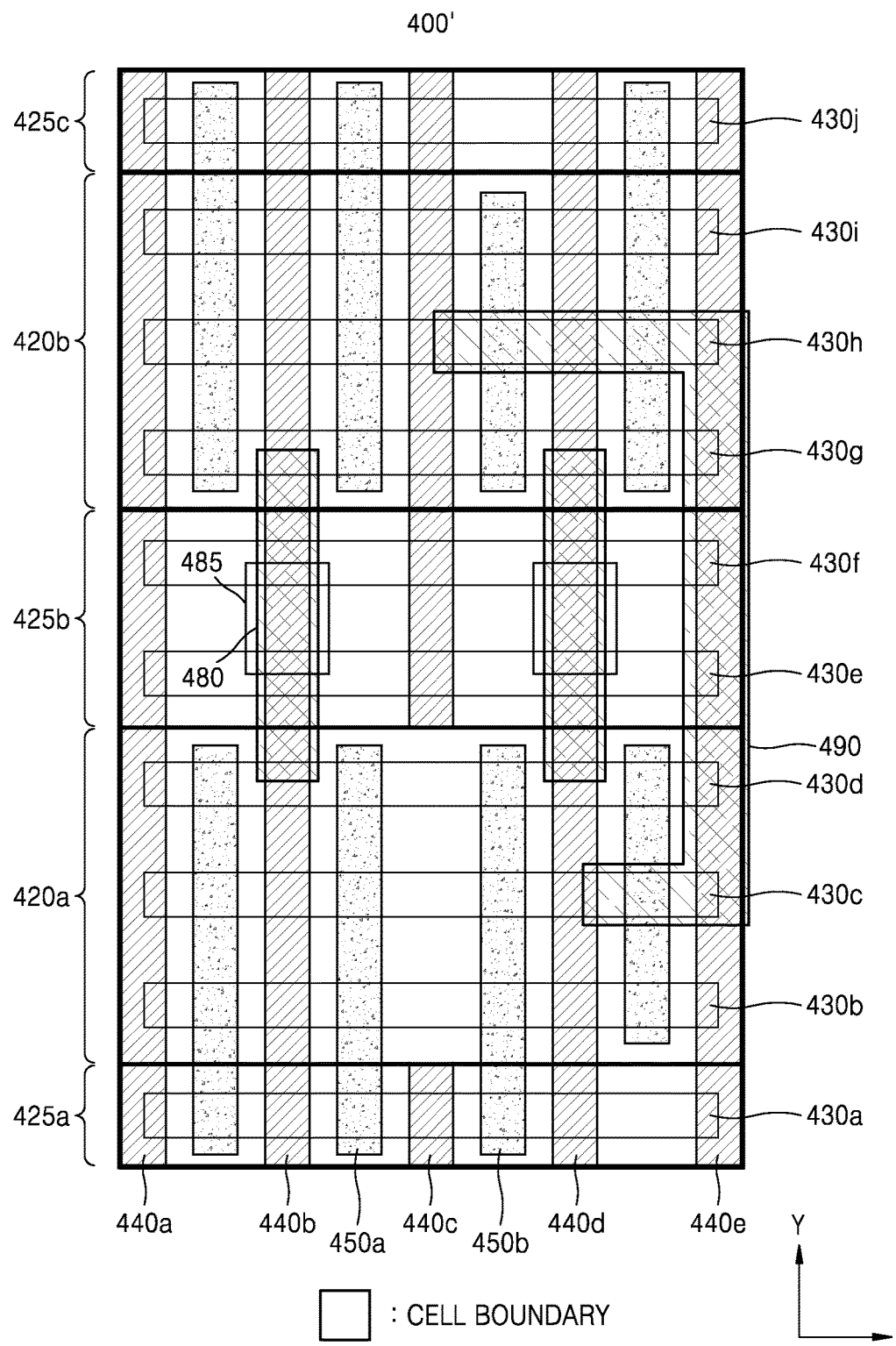
FIG. 22 is a layout illustrating a portion of an IC that is substantially the same as the example embodiment of FIG. 21.

FIG. 22 is a layout illustrating a portion of an IC 400' that is substantially the same as the example embodiment of FIG. 21.

Referring to FIG. 22, the IC 400' may include the first to tenth fins 430a to 430j, the plurality of gate electrodes 440b, 440c, and 440d, the plurality of dummy gate electrodes 440a and 440e, the plurality of source and drain contacts 450a and 450b, the second contact 460, the two input terminals 480, the two input contacts 485, and the output terminal 490. The plurality of source and drain contacts 450a and 450b on the first active region 420a may be connected to an identical metal line above the plurality of source and drain contacts 450a and 450b. According to other example embodiments, the IC 400' may include only one of the plurality of source and drain contacts 450a and 450b on the first active region 420a.

The plurality of source and drain contacts 450a and 450b and the second contact 460 included in the layout shown in FIG. 21 may form an H-shaped jumper. Therefore, when the IC 400 is actually manufactured, the IC 400 may be substantially the same as the IC 400' that corresponds to the layout shown in FIG. 22. In other words, as shown in FIG. 22, due to the H-shaped jumper in the layout shown in FIG. 21, the gate electrode 440c in the first active region 420a of FIG. 22 may be skipped. Therefore, each of the ICs 400 and 400' may include two NMOS fin transistors in the first active region 420a and three PMOS fin transistors in the second active region 420b.

Figure 23:
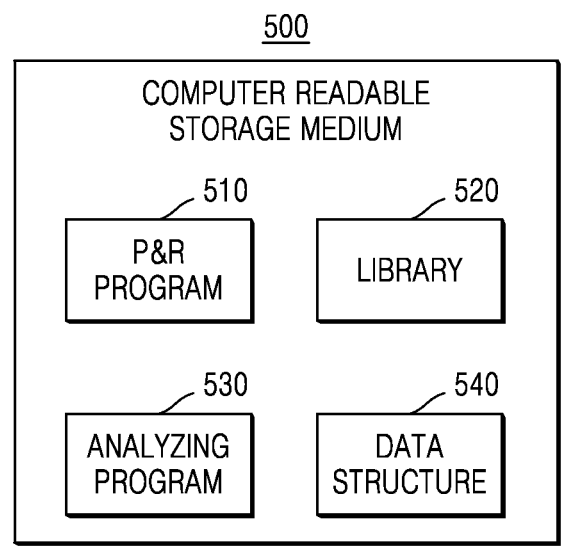
FIG. 23 is a block diagram illustrating a storage medium according to an example embodiment.

FIG. 23 is a block diagram illustrating a computer-readable storage medium 500 according to some example embodiments.

Referring to FIG. 23, the computer-readable storage medium 500 may include a storage medium that may be read by a computer, for example, to provide commands and/or data to the computer. The computer-readable storage medium 500 may be non-transitory. For example, the non-transitory computer-readable storage medium 500 may include a magnetic storage medium (e.g., a disk or a tape) and an optical recording medium (a CD-ROM, a DVD-ROM, a CD-R, a CD-RW, a DVD-R, and a DVD-RW), volatile or non-volatile memory (e.g., RAM, ROM, or flash memory), non-volatile memory that may accessed via USB interface, and microelectromechanical systems (MEMS). The computer-readable recording medium may be inserted into a computer, integrated into the computer, or combined with the computer via a communication medium such as a network and/or a wireless link.

As shown in FIG. 23, the computer-readable storage medium 500 may have stored therein a position and wiring program 510, a library 520, an analyzing program 530, and a data structure 540. The position and wiring program 510 may store a plurality of commands for executing a method of using a standard cell library or a method of designing ICs according to example embodiments of the inventive concepts. For example, the computer-readable storage medium 500 may store the position and wiring program 510 that includes arbitrary commands for executing all or a portion of methods described with reference to the drawings above. The library 520 may include information about a standard cell that is a unit included in the IC.

The analyzing program 530 may include a plurality of commands for executing a method of analyzing the IC based on data defining the IC. The data structure 540 may include storage spaces for managing data generated during processes of using a standard cell library in the library 520, extracting marker information from a general standard cell library in the library 520, or analyzing the timing characteristics of the IC performed by the analyzing program 530.

Figure 24:
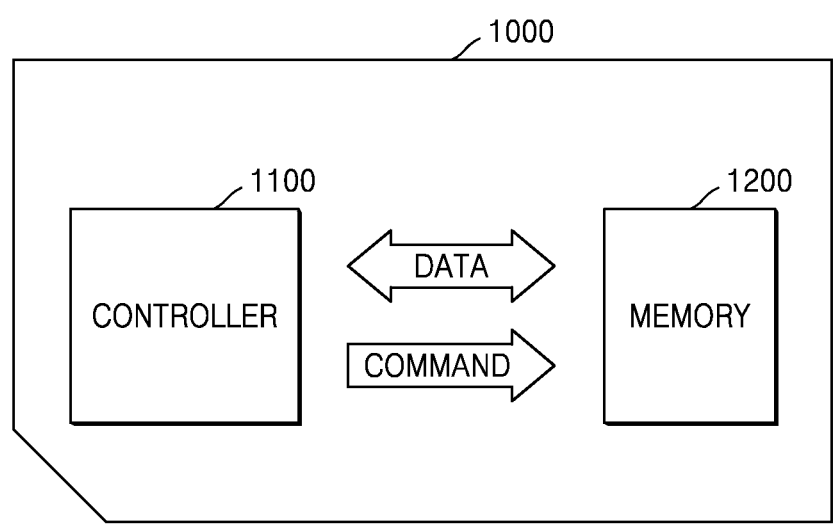
FIG. 24 is a block diagram illustrating a memory card including an IC according to an example embodiment.

FIG. 24 is a block diagram illustrating a memory card 1000 including an IC according to some example embodiments.

Referring to FIG. 24, in the memory card 1000, a controller 1100 and a memory 1200 may be disposed to exchange electric signals, for example, via a bus. For example, when the controller 1100 commands, the memory 1200 may transmit data.

The controller 1100 and the memory 1200 may include an IC according to example embodiments of the inventive concepts. Specifically, in at least one semiconductor device from among a plurality of semiconductor devices in the controller 1100 and the memory 1200, at least one conductive line may be skipped by forming a single node. The single node may be formed by electrically connecting at least two first contacts that extend in the first direction (e.g., the Y direction), a second contact that extends in the second direction (e.g., the X direction) that is perpendicular to the first direction, and at least one conductive lines that extend in the first direction.

The memory card 1000 may be one selected from various types of memory cards, for example, a memory stick card, a smart media (SM) card, a secure digital (SD) card, a mini SD card, and a multimedia card (MMC).

Figure 25:
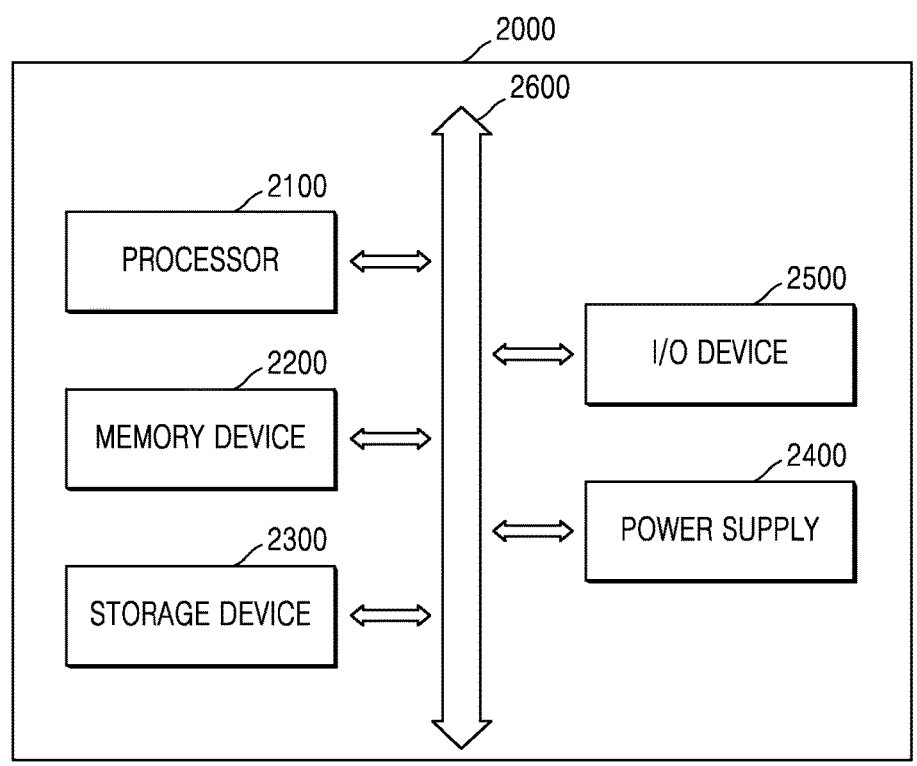
FIG. 25 is a block diagram illustrating a computing system including an IC according to an example embodiment.

FIG. 25 is a block diagram illustrating a computing system 2000 including an IC according to some example embodiments.

Referring to FIG. 25, the computing system 2000 may include a processor 2100, a memory device 2200, a storage device 2300, a power supply 2400, and an input/output (I/O) device 2500. Although not illustrated in FIG. 25, the computing system 2000 may additionally include ports for communicating with video cards, sound cards, memory cards, USB devices, or other electronic devices.

The processor 2100, the memory device 2200, the storage device 2300, the power supply 2400, and the I/O device 2500 included in the computing system 2000 may include an IC according to example embodiments of the inventive concepts. Specifically, in at least one semiconductor device from among a plurality of semiconductor devices in the processor 2100, the memory device 2200, the storage device 2300, the power supply 2400, and the I/O device 2500, at least one conductive line may be skipped by forming a single node. The single node may be formed by electrically connecting at least two first contacts that extend in the first direction (e.g., the Y direction), a second contact that extends in the second direction (e.g., the X direction) that is perpendicular to the first direction, and at least one conductive lines that extend in the first direction.

The processor 2100 may execute desired (or, alternatively, predetermined) computations or tasks. According to example embodiments, the processor 2100 may be a microprocessor) or a central processing unit (CPU). The processor 2100 may communicate with the memory device 2200, the storage device 2300, and the I/O device 2500 via a bus 2600 such as an address bus, a control bus, and a data bus. According to some example embodiments, the processor 2100 may be connected to an expansion bus such as a peripheral component interconnect (PCI) bus.

The memory device 2200 may store data necessary for operations of the computing system 2000. For example, the memory device 2200 may be a dynamic random access memory (DRAM), a mobile DRAM, a static RAM (SRAM), a phase-change RAM (PRAM), a ferroelectric RAM (FRAM), a resistive RAM (RRAM), and/or a magnetoresistive RAM (MRAM). The storage device 2300 may include a solid state drive (SSD), a hard disk drive (HDD), and a CD-ROM.

The I/O device 2500 may include an input device such as a keyboard, a keypad, and a mouse, and an output device such as a printer and a display. The power supply 2400 may provide operation voltages required for the operations of the computing system 2000.

The IC according to example embodiments may be assembled into various types of packages. For example, at least some components of the IC may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While example embodiments of the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a plurality of standard cells including a first standard cell and a second standard cell, each of the plurality of standard cells including a substrate,
   wherein the first standard cell includes:
      a first gate electrode disposed on the substrate of the first standard cell;
      a second gate electrode disposed on the substrate of the first standard cell;
      a third gate electrode disposed on the substrate of the first standard cell, the second gate electrode being disposed between the first gate electrode and the third gate electrode;
      a first contact disposed between the first gate electrode and the second gate electrode;
      a second contact disposed between the second gate electrode and the third gate electrode; and
      a third contact disposed on the first contact, the second gate electrode and the second contact, and configured to be electrically connected to the first contact, the second gate electrode and the second contact, the third contact contacting the first contact, the second gate electrode and the second contact, the third contact being configured to be electrically isolated from the first gate electrode, and
   wherein either the first standard cell or the second standard cell includes:
      a fourth gate electrode disposed on the substrate of either the first standard cell or the second standard cell;
      a fifth gate electrode disposed on the substrate of either the first standard cell or the second standard cell;
      a sixth gate electrode disposed on the substrate of either the first standard cell or the second standard cell, the fifth gate electrode being disposed between the fourth gate electrode and the sixth gate electrode;
      a fourth contact disposed between the fourth gate electrode and the fifth gate electrode;
      a fifth contact disposed between the fifth gate electrode and the sixth gate electrode; and
      a sixth contact disposed on the fourth contact, the fifth gate electrode and the fifth contact, and configured to be electrically connected to the fourth contact, the fifth gate electrode and the fifth contact, the sixth contact contacting the fourth contact, the fifth gate electrode and the fifth contact, the sixth contact being configured to be electrically isolated from the fourth gate electrode.

2. The semiconductor device of claim 1, wherein
   a length of the second contact is same as a length of the first contact, and
   a length of the fifth contact is same as a length of the fourth contact.

3. The semiconductor device of claim 1, wherein
   a length of the second contact is same as a length of the first contact, and
   a length of the fifth contact is different from a length of the fourth contact.

4. The semiconductor device of claim 1, wherein
   a length of the second contact is different from a length of the first contact, and
   a length of the fifth contact is different from a length of the fourth contact.

5. The semiconductor device of claim 1, wherein
a width of the second contact is same as a width of the first contact, and
a width of the fifth contact is same as a width of the fourth contact.

6. The semiconductor device of claim 1, wherein
a width of the second contact is same as a width of the first contact, and
a width of the fifth contact is different from a width of the fourth contact.

7. The semiconductor device of claim 1, wherein
a width of the second contact is different from a width of the first contact, and
a width of the fifth contact is different from a width of the fourth contact.

8. The semiconductor device of claim 1, wherein
the first standard cell includes the fourth gate electrode, the fifth gate electrode, the sixth gate electrode, the fourth contact, the fifth contact and the sixth contact,
the fourth gate electrode is the first gate electrode,
the fifth gate electrode is the second gate electrode, and
the sixth gate electrode is the third gate electrode.

9. The semiconductor device of claim 8, wherein
the substrate of the first standard cell includes a first active region and a second active region,
the first contact, the second contact and the third contact are disposed on the first active region, and
the fourth contact, the fifth contact and the sixth contact are disposed on the second active region.

10. The semiconductor device of claim 9, wherein the first standard cell further includes a cutting region disposed between the first active region and the second active region, and configured to electrically insulate the second gate electrode on the second active region from the second gate electrode on the first active region.

11. The semiconductor device of claim 1, wherein the second standard cell includes the fourth gate electrode, the fifth gate electrode, the sixth gate electrode, the fourth contact, the fifth contact and the sixth contact.

12. The semiconductor device of claim 1, wherein
the fourth gate electrode is different from the first gate electrode,
the fifth gate electrode is different from the second gate electrode, and
the sixth gate electrode is different from the third gate electrode.

13. The semiconductor device of claim 1, wherein the first standard cell further includes a seventh gate electrode disposed on the substrate, the seventh gate electrode being disposed between the second gate electrode and the second contact.

14. The semiconductor device of claim 12, wherein the second standard cell further includes an eighth gate electrode disposed on the substrate, the eighth gate electrode being disposed between the fifth gate electrode and the fifth contact.

15. A semiconductor device comprising:
a substrate,
a first gate electrode disposed on the substrate;
a second gate electrode disposed on the substrate;
a third gate electrode disposed on the substrate, the second gate electrode being disposed between the first gate electrode and the third gate electrode;
a fourth gate electrode disposed on the substrate, the third gate electrode being disposed between the second gate electrode and the fourth gate electrode;
a fifth gate electrode disposed on the substrate;
a sixth gate electrode disposed on the substrate;
a seventh gate electrode disposed on the substrate, the sixth gate electrode being disposed between the fifth gate electrode and the seventh gate electrode;
a first contact disposed between the first gate electrode and the second gate electrode;
a second contact disposed between the third gate electrode and the fourth gate electrode;
a third contact disposed on the first contact, the second gate electrode, the third gate electrode and the second contact, and configured to be electrically connected to the first contact, the second gate electrode, the third gate electrode and the second contact, the third contact contacting the first contact, the second gate electrode, the third gate electrode and the second contact, the third contact being configured to be electrically isolated from the first gate electrode and the fourth gate electrode;
a fourth contact disposed between the fifth gate electrode and the sixth gate electrode;
a fifth contact disposed between the sixth gate electrode and the seventh gate electrode; and
a sixth contact disposed on the fourth contact, the sixth gate electrode and the fifth contact, and configured to be electrically connected to the fourth contact, the sixth gate electrode and the fifth contact, the sixth contact contacting the fourth contact, the sixth gate electrode and the fifth contact, the sixth contact being configured to be electrically isolated from the fifth gate electrode and the seventh gate electrode.

16. The semiconductor device of claim 15, wherein the third contact and the sixth contact are disposed in a same standard cell.

17. The semiconductor device of claim 15, wherein
the third contact is disposed in a first standard cell, and
the sixth contact is disposed in a second standard cell that is different from the first standard cell.

18. The semiconductor device of claim 15, wherein
a size of the first contact is same as a size of the second contact, and
a size of the fourth contact is same as a size of the fifth contact.

19. The semiconductor device of claim 15, wherein
a size of the first contact is same as a size of the second contact, and
a size of the fourth contact is different from a size of the fifth contact.

20. The semiconductor device of claim 15, wherein
a size of the first contact is different from a size of the second contact, and
a size of the fourth contact is different from a size of the fifth contact.

21. A semiconductor device comprising:
a substrate including a first active region and a second active region;
a plurality of gate electrodes disposed on the substrate, and including a first gate electrode, a second gate electrode and a third gate electrode, the second gate electrode being disposed between the first gate electrode and the third gate electrode;
a first contact disposed between the first gate electrode and the second gate electrode, and disposed on the first active region;
a second contact disposed between the second gate electrode and the third gate electrode, and disposed on the first active region;

a third contact disposed between the first gate electrode and the second gate electrode, and disposed on the second active region;

a fourth contact disposed between the second gate electrode and the third gate electrode, and disposed on the second active region;

a fifth contact disposed on the first contact, the second gate electrode and the second contact, and configured to be electrically connected to the first contact, the second gate electrode and the second contact; and a cutting region disposed between the first active region and the second active region, and configured to electrically insulate the second gate electrode on the second active region from the second gate electrode on the first active region, wherein the fifth contact is configured to be electrically isolated from the first gate electrode and the third gate electrode.

22. The semiconductor device of claim 21, wherein the fifth contact contacts the first contact, the second gate electrode and the second contact.

23. The semiconductor device of claim 21, wherein a length of the first contact is same as a length of the second contact.

24. The semiconductor device of claim 21, wherein a length of the first contact is different from a length of the second contact.

25. The semiconductor device of claim 21, further comprising:
 a sixth contact disposed on and electrically connected to the first gate electrode; and
 a seventh contact disposed on and electrically connected to the third gate electrode.

26. The semiconductor device of claim 21, wherein the fifth contact provides a power voltage or a ground voltage to the second gate electrode, the first contact and the second contact.

27. The semiconductor device of claim 21, wherein a conductivity type of the first active region is different from a conductivity type of the second active region.

28. The semiconductor device of claim 21, wherein a number of transistors in the first active region is different from a number of transistors in the second active region.

29. A semiconductor device comprising:
 a substrate including a first active region and a second active region;
 a plurality of first fins disposed in the first active region;
 a plurality of second fins disposed in the second active region;
 a plurality of gate electrodes disposed on the substrate, and including a first gate electrode, a second gate electrode, a third gate electrode and a fourth gate electrode, the second gate electrode being disposed between the first gate electrode and the third gate electrode, the third gate electrode being disposed between the second gate electrode and the fourth gate electrode;
 a first contact disposed between the first gate electrode and the second gate electrode, and disposed on the first active region;
 a second contact disposed between the third gate electrode and the fourth gate electrode, and disposed on the first active region;
 a third contact disposed between the first gate electrode and the second gate electrode, and disposed on the second active region;
 a fourth contact disposed between the third gate electrode and the fourth gate electrode, and disposed on the second active region;
 a fifth contact disposed on the first contact, the second gate electrode, the third gate electrode and the second contact, and configured to be electrically connected to the first contact, the second gate electrode, the third gate electrode and the second contact; and
 a cutting region disposed between the first active region and the second active region, configured to electrically insulate the second gate electrode on the second active region from the second gate electrode on the first active region, and configured to electrically insulate the third gate electrode on the second active region from the third gate electrode on the first active region, wherein
  the fifth contact is configured to be electrically isolated from the first gate electrode and the fourth gate electrode, and
  the fifth contact contacts the first contact, the second gate electrode, the third gate electrode and the second contact.

30. The semiconductor device of claim 29, further comprising:
 a sixth contact disposed between the second gate electrode and the third gate electrode, the sixth contact being electrically connected to the fifth contact.

* * * * *